US012696584B2

(12) United States Patent
Cha et al.

(10) Patent No.: US 12,696,584 B2
(45) Date of Patent: Jul. 28, 2026

(54) UNIT PIXEL AND DISPLAYING APPARATUS INCLUDING THE UNIT PIXEL

(71) Applicant: SEOUL VIOSYS CO., LTD., Gyeonggi-do (KR)

(72) Inventors: Namgoo Cha, Gyeonggi-do (KR); Sang Min Kim, Gyeonggi-do (KR); Seongchan Park, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 634 days.

(21) Appl. No.: 17/540,338

(22) Filed: Dec. 2, 2021

(65) Prior Publication Data

US 2022/0199857 A1    Jun. 23, 2022

Related U.S. Application Data

(60) Provisional application No. 63/274,662, filed on Nov. 2, 2021, provisional application No. 63/126,744, filed on Dec. 17, 2020.

(51) Int. Cl.
*H10H 20/82* (2025.01)
*H10H 20/80* (2025.01)
(Continued)

(52) U.S. Cl.
CPC .......... *H10H 20/82* (2025.01); *H10H 20/855* (2025.01); *H10H 20/857* (2025.01); *H10W 90/00* (2026.01); *H10H 20/882* (2025.01)

(58) Field of Classification Search
CPC .. G02B 5/0247; H10K 50/854; H10K 59/877; H01L 25/0753; H01L 2933/0091; H01L 33/62; H01L 33/58; H01L 33/22; H01L 25/167; G09G 2300/046; H10H 20/82; H10H 20/855; H10H 20/857; H10H 20/882; H10H 20/872; H10H 20/819;
(Continued)

(56) References Cited

U.S. PATENT DOCUMENTS

2014/0353705 A1    12/2014    Kamikawa et al.
2016/0093782 A1    3/2016    Vampola et al.
(Continued)

FOREIGN PATENT DOCUMENTS

JP    2010134303 A    6/2010
JP    2010153594 A    7/2010
(Continued)

OTHER PUBLICATIONS

International Search Report issued in corresponding International Application No. PCT/KR2021/019256, mailed Mar. 30, 2022, 3 pages.
(Continued)

*Primary Examiner* — Julio J Maldonado
*Assistant Examiner* — Nathan Pridemore
(74) *Attorney, Agent, or Firm* — LaBatt, LLC

(57) ABSTRACT

A unit pixel and a displaying apparatus including the unit pixel are provided. The unit pixel includes a transparent substrate, and a plurality of light emitting devices arranged on the transparent substrate. The transparent substrate includes at least one light scattering line disposed therein so as to correspond to each of the plurality of light emitting devices.

20 Claims, 17 Drawing Sheets

100

B                                                                                                          B'

131 127   131a   129a        127b  131 10a  127a  131d   129d  122

125
123
121L
121

0                    0

123a                      121p
121s

(51) Int. Cl.

| | | |
|---|---|---|
| *H10H 20/855* | (2025.01) | |
| *H10H 20/857* | (2025.01) | |
| *H10W 90/00* | (2026.01) | |

(58) Field of Classification Search

CPC .... H10H 99/00; H10H 29/855; H10H 29/882; H10H 29/872; H10H 29/30; H10H 29/0363; H10W 90/00

See application file for complete search history.

(56) References Cited

U.S. PATENT DOCUMENTS

| | | | | |
|---|---|---|---|---|
| 2017/0047492 | A1 | 2/2017 | Vampola et al. | |
| 2018/0198046 | A1* | 7/2018 | Hwang | H10H 20/856 |
| 2018/0315887 | A1* | 11/2018 | Choi | H10H 20/819 |
| 2019/0074266 | A1* | 3/2019 | Andrews | H10H 29/142 |
| 2020/0161586 | A1* | 5/2020 | Lee | H10K 50/858 |
| 2020/0266392 | A1* | 8/2020 | Lee | H10K 59/40 |
| 2020/0335677 | A1* | 10/2020 | Ohashi | H01L 25/0753 |
| 2021/0126042 | A1* | 4/2021 | Basin | H01L 27/156 |

FOREIGN PATENT DOCUMENTS

| | | | |
|---|---|---|---|
| JP | 6199281 | B2 | 9/2017 |
| KR | 1020200058039 | A | 5/2020 |
| KR | 1020200101552 | A | 8/2020 |

OTHER PUBLICATIONS

Extended European Search Report for European Patent Application No. 2190744.6, Oct. 4, 2024, 10 pages.

Office Action for corresponding Japanese Patent Application No. 2023-537181, Jan. 27, 2026, 2 pages (no English translation available).

Office Action for corresponding Japanese Patent Application No. 2023-537181, Oct. 14, 2025, 4 pages (no English translation available).

\* cited by examiner

FIG. 7

UNIT PIXEL AND DISPLAYING APPARATUS INCLUDING THE UNIT PIXEL

CROSS-REFERENCE OF RELATED APPLICATIONS AND PRIORITY

The Present Application is a Non-provisional Application claiming priority to and benefit of U.S. Provisional Applications Nos. 63/126,744 filed Dec. 17, 2020 and 63/274,662 filed Nov. 2, 2021, the disclosure of which are incorporated by reference as if they are fully set forth herein.

TECHNICAL FIELD

The present disclosure relates to a unit pixel and a displaying apparatus having the unit pixel, and more particularly, to a unit pixel including a light emitting device and a displaying apparatus having the unit pixel.

BACKGROUND

Light emitting diodes are semiconductor devices using a light emitting diode which is an inorganic light source and are used in various fields such as displaying apparatuses, vehicle lamps, and general lightings. As the light emitting diodes have advantages such as long lifespan, low power consumption, and quick response, the light emitting diodes have been replacing conventional light sources.

Conventional light emitting diodes have been generally used as backlight light sources in displaying apparatuses. Recently, displaying apparatuses that directly realize images using the light emitting diodes have been developed. Such displays are also referred to as micro LED displays.

The displaying apparatus generally implements various colors using a mixed color of blue, green, and red, includes a plurality of pixels to implement various images. Each pixel has blue, green, and red sub-pixels. As such, a color of a certain pixel is typically determined based on the colors of the sub-pixels, so that images can be displayed through the combination of such pixels.

In a case of the micro LED display, micro LEDs are arranged on a plane corresponding to each sub-pixel, and a large number of micro LEDs are mounted on a single substrate. However, the micro LED is extremely small, for example, 200 μm or less, further 100 μm or less, and these small sizes may present certain restrictions. For instance, it is difficult to directly mount the light emitting diodes on a display panel due to handling the micro LEDs having their small sizes. Furthermore, viewing angles of light emitted from the sub-pixels are different from one another and mixing of light may not be uniform and thus, colors may be different depending on an angle at which a user sees an image.

SUMMARY

An object of the present disclosure is to provide a unit pixel capable of mitigating a color difference depending on viewing angles by controlling light patterns of light emitting devices, and a displaying apparatus having the same. In the exemplary embodiments, a micro LED light pattern depending on the viewing angle may not deteriorate as its size decreases. Therefore, so as to implement a displaying apparatus using smaller-sized micro LEDs, the exemplary embodiments provides a technique for improving a light pattern depending on the viewing angle of the micro LEDs.

A unit pixel according to an exemplary embodiment of the present disclosure includes: a transparent substrate, and a plurality of light emitting devices arranged on the transparent substrate, in which the transparent substrate includes at least one light scattering line disposed therein so as to correspond to each of the plurality of light emitting devices.

In at least one variant, the at least one light scattering line may be continuous or may include voids spaced apart from one another.

In another variant, the light scattering line may extend from one side of the transparent substrate to the other side opposite thereto.

In another variant, the at least one light scattering line may include a plurality of light scattering lines orthogonal to one another.

In another variant, the plurality of light scattering lines may be disposed so as to cover upper regions of the light emitting devices.

In another variant, the plurality of light scattering lines may partially overlap at least one of the light emitting devices.

In another variant, the plurality of light scattering lines may include a line crossing the upper regions of the light emitting devices and lines crossing the upper regions of each of the light emitting devices.

In another variant, the unit pixel may further include a light blocking layer disposed between the transparent substrate and the light emitting devices. The light blocking layer may have at least one window configured to pass light generated from the light emitting devices, and the at least one light scattering line may be disposed so as to correspond to the window.

In another variant, the light blocking layer may have a plurality of windows respectively corresponding to the light emitting devices, and the at least one light scattering line may include a plurality of light scattering lines disposed so as to cover the plurality of windows.

In another variant, the at least one light scattering line may cross an upper region of the at least one window.

In another variant, the at least one light scattering line may have an average height of 10 μm or less.

According to an exemplary embodiment, a sub-pixel constituting a unit pixel is provided. The sub-pixel includes: a transparent substrate; and a light emitting device disposed on the transparent substrate, in which the transparent substrate includes at least one light scattering line.

In another variant, the at least one light scattering line may be continuous or may include voids spaced apart from one another.

In another variant, the light scattering line may extend from one side of the transparent substrate to the other side opposite thereto.

A displaying apparatus according to an exemplary embodiment includes: a circuit board; and a plurality of unit pixels disposed on the circuit board. Each of the plurality of unit pixels includes: a plurality of light emitting devices; and a transparent substrate covering the plurality of light emitting devices, in which the transparent substrate includes at least one light scattering line disposed therein so as to correspond to each of the plurality of light emitting devices.

In at least one variant, the at least one light scattering line may include a continuous void or may include voids spaced apart from one another.

In another variant, the light scattering line may extend from one side of the transparent substrate to the other side opposite thereto.

In another variant, the unit pixel may further include a light blocking layer disposed between the transparent substrate and the light emitting devices, in which the light blocking layer may have at least one window configured to pass light generated from the light emitting devices, and the at least one light scattering line may be disposed so as to correspond to the window.

In another variant, the transparent substrate may include a plurality of regions spaced apart from one another and respectively disposed on the light emitting devices, and the light scattering line may be disposed in each region of the transparent substrate.

In another variant, the circuit board may have pads, and each of the unit pixels may be bonded to the pads through a bonding material.

According to one or more embodiments of the present disclosure, a unit pixel includes a transparent substrate including a light incident surface and a light exiting surface and a plurality of light emitting devices arranged on the transparent substrate and operable to emit light of different colors from one another. The light generated from the plurality of light emitting devices enters via the light incident surface of the transparent substrate and exits the transparent substrate through the light exiting surface. At least one light scattering line is disposed in the transparent substrate and corresponds to one or more of the plurality of light emitting devices in a predetermined pattern.

In at least one variant, the at least one light scattering line further includes a continuous void or voids spaced apart from one another. The at least one light scattering line extends from one side of the transparent substrate to the other side opposite thereto. The at least one light scattering line further includes a plurality of light scattering lines positioned to be orthogonal to one another.

In another variant, the plurality of light scattering lines is disposed to surround the light emitting devices.

In another variant, a plurality of windows corresponds to and expose one or more of the plurality of light emitting devices. The plurality of light scattering lines overlaps with the one or more of the plurality of light emitting devices by extending over and across one or more windows among the plurality of windows.

In another variant, the plurality of light scattering lines includes a first line crossing over the entire light emitting devices and a plurality of second lines crossing over each of the light emitting devices.

In another variant, a light blocking layer disposed between the transparent substrate and the plurality of light emitting devices arranged on a coplanar surface. The light blocking layer has at least one window configured to pass light generated from the light emitting devices. The at least one light scattering line is disposed so as to correspond to the window.

In another variant, the light blocking layer has a plurality of windows respectively corresponding to the light emitting devices, and the at least one light scattering line includes a plurality of light scattering lines disposed across, or around the plurality of windows.

In another variant, the at least one light scattering line crosses over the at least one window. The at least one light scattering line has an average height of 10 μm or less.

According to one or more embodiments of the present disclosure, a unit pixel includes a plurality of sub-pixels comprising a first sub-pixel and a second sub-pixel. The first sub-pixel includes a first transparent substrate and a first light emitting device disposed on the first transparent substrate and operable to emit light of a selected color. The second sub-pixel includes a second transparent substrate and a second light emitting device disposed on the first transparent substrate and operable to emit light of a different color from the first light emitting device. At least one light scattering line is disposed in the first transparent substrate, in the second transparent substrate, or both and positioned to be around or across the first light emitting device, the second light emitting device, or both in at least one predetermined pattern.

In at least one variant, the first transparent substrate and the second transparent substrate form a common transparent substrate including a light incident surface and a light exiting surface. The at least one light scattering line includes continuous voids or voids spaced apart from one another arranged in the common transparent substrate. The light scattering line extends from one side of the transparent substrate to the other side opposite thereto.

In another variant, the first transparent substrate is arranged on the first light emitting device and the second transparent substrate is arranged on the second light emitting device. The at least one light scattering line is arranged in the first transparent substrate and the second transparent substrate and includes voids spaced apart from one another. The first transparent substrate, the second transparent substrate, or both include a growing substrate for growing the first light emitting device, the second light emitting device, or both.

In another variant, a displaying apparatus includes a circuit board, and a plurality of unit pixels disposed on the circuit board. Each of the plurality of unit pixels includes a plurality of light emitting devices operable to emit light of different colors from one another and a transparent substrate covering the plurality of light emitting devices and including a light incident surface and a light exiting surface. The light generated from the plurality of light emitting devices enters via the light incident surface of the transparent substrate and exits the transparent substrate through the light exiting surface. At least one light scattering line disposed in the transparent substrate and correspond to one or more of the plurality of light emitting devices in a predetermined pattern.

In another variant, the at least one light scattering line further includes a continuous void or voids spaced apart from one another.

In another variant, the at least one light scattering line extends from one side of the transparent substrate to an opposite side of the transparent substrate.

In another variant, the plurality of light emitting devices are spaced apart and arranged on the transparent substrate, and each unit pixel further comprises a light blocking layer disposed between the transparent substrate and a respective light emitting device. The light blocking layer has at least one window configured to pass light generated from the light emitting devices towards the light incident surface of the transparent substrate. The at least one light scattering line is disposed so as to correspond to the window.

In another variant, the transparent substrate further includes a plurality of discontinuous regions separated from and spaced apart from one another, the plurality of discontinuous regions corresponds to the plurality of light emitting devices and respectively disposed on the corresponding light emitting devices. The at least one light scattering line is disposed in each region of the transparent substrate.

In another variant, the circuit board further includes a plurality of pads. Each of the unit pixels is bonded to the plurality of pads through a bonding material.

DESCRIPTION OF DRAWINGS

FIG. 7 is a schematic cross-sectional view illustrating a unit pixel according to another exemplary embodiment.

FIG. 10A illustrates a graph scanned in the x-direction as shown in FIG. 3B; and FIG. 10B illustrates a graph scanned in the y-direction as shown in FIG. 3B.

FIG. 11A illustrates a graph scanned in the x-direction as shown in FIG. 3B; and FIG. 11B illustrates a graph scanned in the y-direction as shown in FIG. 3B.

FIG. 12A illustrates a graph scanned in the y-direction as shown in FIG. 3B; and FIG. 12B illustrates a graph scanned in the y-direction as shown in FIG. 3B.

FIG. 13A illustrates light scattering lines disposed in a rectangular shape so as to define same areas as those of the light emitting devices;

FIG. 13B illustrates light scattering lines disposed in the rectangular shape so as to define areas smaller than those of the light emitting devices;

FIG. 13C illustrates light scattering lines disposed to cross each of the light emitting devices in a vertical direction;

FIG. 13D illustrates light scattering lines disposed to cross each of them in a diagonal direction;

FIG. 13E illustrates light scattering lines disposed so as to define larger areas than those of the light emitting devices; and FIG. 13F illustrates light scattering lines disposed in the rectangular shape and those crossing the light emitting devices in the diagonal direction are disposed overlapping with one another.

DETAILED DESCRIPTION OF EMBODIMENTS

Figure 1:
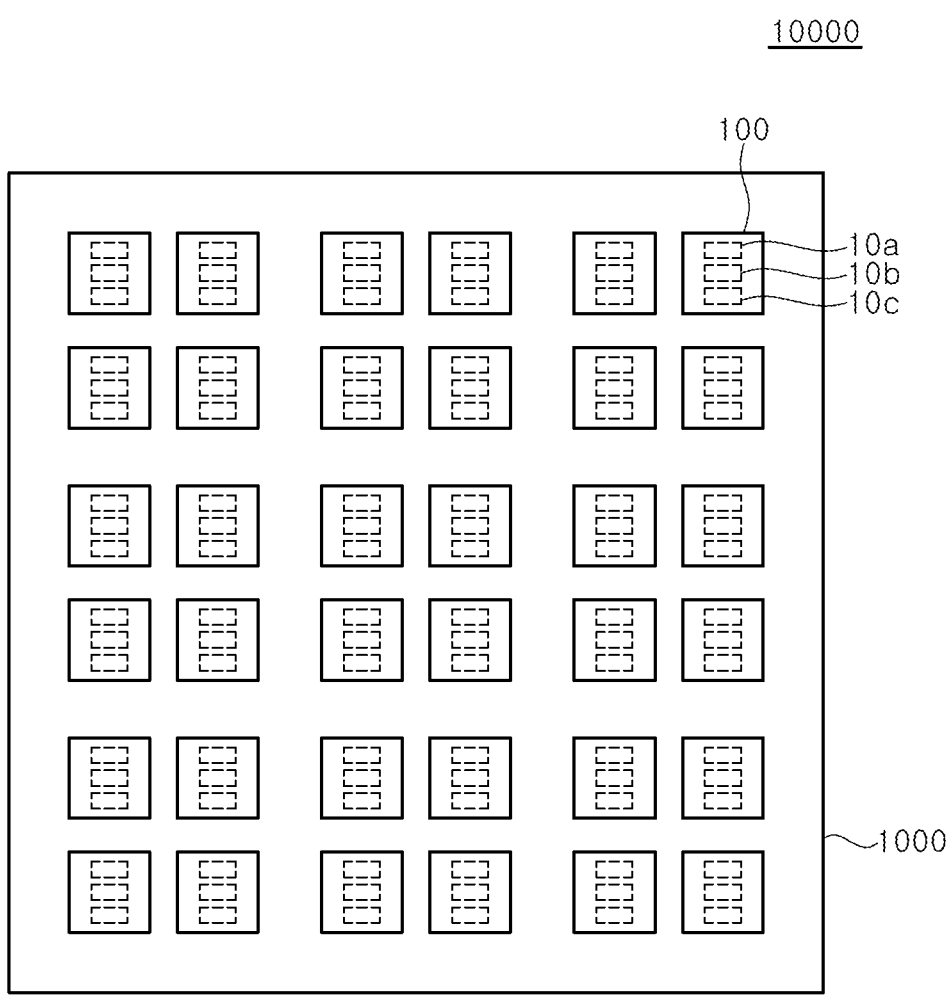
FIG. 1 is a schematic plan view illustrating a displaying apparatus according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

FIG. 1 is a plan view illustrating a displaying apparatus 10000 according to an exemplary embodiment.

Referring to FIG. 1, the displaying apparatus 10000 may include a panel substrate 1000 and a plurality of unit pixels 100.

The displaying apparatus 10000 is not particularly limited to, but it may include a VR displaying apparatus such as a micro LED TV, a smart watch, a VR headset, or an AR displaying apparatus such as augmented reality glasses.

The panel substrate 1000 may be formed of a material such as polyimide (PI), FR-4 glass epoxy (FR4), glass, or the like, and may include a circuit for passive matrix driving or active matrix driving. In an exemplary embodiment of the present disclosure, the panel substrate 1000 may include wirings and resistors therein, and, in another exemplary embodiment, the panel substrate 1000 may include wirings, transistors, and capacitors. In addition, the panel substrate 1000 may have pads on its upper surface that can be electrically connected to an internal circuit.

The plurality of unit pixels 100 may be arranged on the panel substrate 1000. The plurality of unit pixels 100 may be arranged in 6×6 as illustrated in FIG. 1, but the inventive concepts are not limited thereto, and may be arranged in various matrices (n×m, n=1, 2, 3, 4 . . . ; m=1, 2, 3, 4 . . . ), such as 2×2, 3×3, 5×5, or the like.

Each of the unit pixels 100 includes a plurality of light emitting devices 10a, 10b, and 10c. The light emitting devices 10a, 10b, and 10c may emit light of different colors from one another. The light emitting devices 10a, 10b, and 10c in each of the unit pixels 100 may be arranged in a predetermined pattern, as illustrated in FIG. 1. In an exemplary embodiment, the light emitting devices 10a, 10b, and 10c may be arranged in a vertical direction with respect to a display screen on which an image is displayed. However, the inventive concepts are not limited thereto, and the light emitting devices 10a, 10b, and 10c may be arranged in a lateral direction with respect to the display screen on which the image is displayed.

Hereinafter, each element of the displaying apparatus 10000 will be described in detail in the order of the light emitting devices 10a, 10b, 10c and the unit pixel 100 disposed in the displaying apparatus 10000.

Figure 2A:
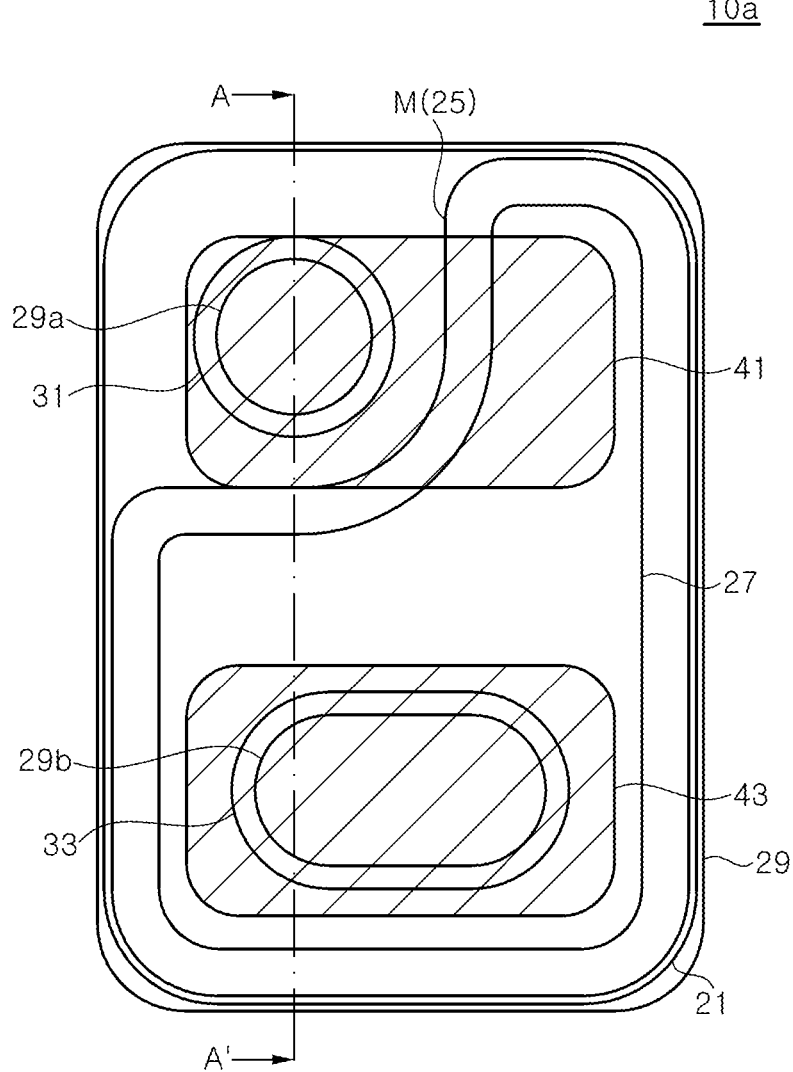
FIG. 2A is a schematic plan view illustrating a light emitting device according to an exemplary embodiment.
Figure 2B:
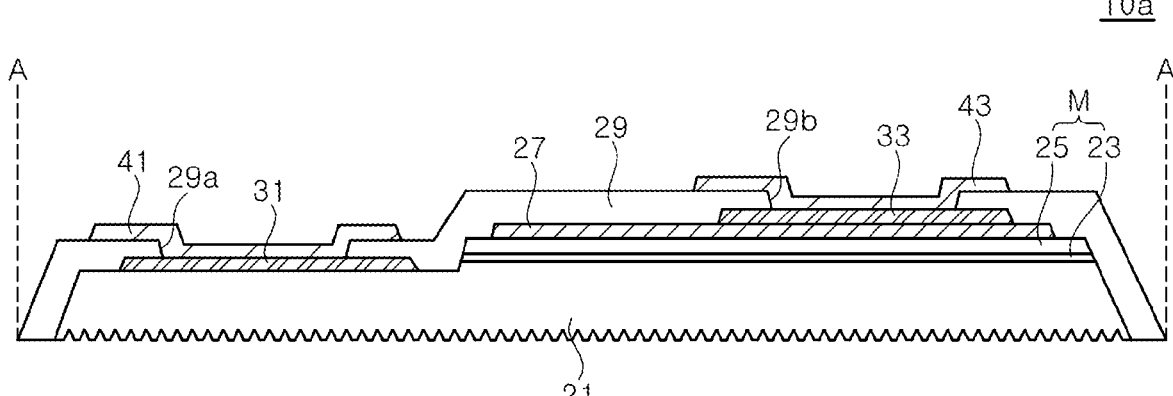
FIG. 2B is a schematic cross-sectional view taken along line A-A' of FIG. 2A.

FIGS. 2A and 2B are a plan view and a cross-sectional view illustrating a light emitting device 10a according to an exemplary embodiment of the present disclosure, respectively.

Referring to FIGS. 2A and 2B, the light emitting device 10a includes a light emitting structure including a first conductivity type semiconductor layer 21, an active layer 23, and a second conductivity type semiconductor layer 25. In addition, the light emitting device 10 may include an ohmic contact layer 27, an insulation layer 29, a first contact pad 31, a second contact pad 33, a first electrode pad 41, and a second electrode pad 43.

The first conductivity type semiconductor layer 21, the active layer 23, and the second conductivity type semiconductor layer 25 may be grown on a growth substrate (not shown). The substrate may be one of various substrates that are used to grow semiconductors, such as a gallium nitride substrate, a GaAs substrate, a Si substrate, a sapphire substrate, especially a patterned sapphire substrate. After the growth of the semiconductor layers is completed, the growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to constitute at least a portion of the first conductivity type semiconductor layer 21.

In the illustrated exemplary embodiment, the plurality of light emitting devices 10a, 10b, and 10c may emit red light, green light, and blue light, respectively. In the exemplary embodiment, although the red light emitting device 10a, the green light emitting device 10b, and the blue light emitting device 10c are shown as being arranged in the order, the present disclosure is not necessarily limited thereto.

Meanwhile, in a case of the light emitting device 10a emitting red light, the semiconductor layers may include aluminum gallium arsenide (AlGaAs), gallium arsenide phosphide (GaAsP), aluminum gallium indium phosphide (AlGaInP), and gallium phosphide (GaP).

In a case of the light emitting device 10b emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In a case of the light emitting device 10c emitting blue light, the semiconductor layers may include gallium nitride (GaN), indium gallium nitride (InGaN), or zinc selenide (ZnSe).

The first conductivity type semiconductor layer 21, the active layer 23, and the second conductivity type semiconductor layer 25 may be grown on the substrate in a chamber using a process such as a Metal Organic Chemical Vapor Deposition (MOCVD) process. In addition, the first conductivity type semiconductor layer 21 may include n-type impurities such as Si, Ge, and Sn, and the second conductivity type semiconductor layer 25 may include p-type impurities such as Mg, Sr, and Ba. For example, the first conductivity type semiconductor layer 21 may include GaN or AlGaN containing Si as a dopant, and the second conductivity type semiconductor layer 25 may include GaN or AlGaN containing Mg as a dopant.

Referring back to FIG. 2B, although the first conductivity type semiconductor layer 21 and the second conductivity type semiconductor layer 25 are shown as single layers in the drawings, these layers may be multiple layers, and may also include a superlattice layer. The active layer 23 may include a single quantum well structure or a multiple quantum well structure, and a composition ratio of a Nitride-based semiconductor may be adjusted to emit a desired wavelength. For example, the active layer 23 may emit red light, green light, blue light, or ultraviolet light depending on a semiconductor material constituting the layer and a composition ratio thereof.

The second conductivity type semiconductor layer 25 and the active layer 23 may have a mesa M structure and may be disposed on the first conductivity type semiconductor layer 21. The mesa M may include the active layer 23 and the second conductivity type semiconductor layer 25. In addition, the mesa M may include at least a portion of the first conductivity type semiconductor layer 21. The mesa M may be located on a partial region of the first conductivity type semiconductor layer 21, and an upper surface of the first conductivity type semiconductor layer 21 may be exposed around the mesa M.

In an exemplary embodiment of the present disclosure, the light emitting device 10 may be formed by separating the growth substrate, and thus, the first conductivity type semiconductor layer 21 may be exposed on a lower surface of the light emitting device 10. The first conductivity type semiconductor layer 21 may have a concave-convex pattern through surface texturing as shown in FIG. 2B, but the inventive concepts are not limited thereto, and may have a flat surface. The concave-convex pattern may be formed through surface texturing using a dry or wet etching process.

The ohmic contact layer 27 may be in ohmic contact with the second conductivity type semiconductor layer 25 and disposed on the second conductivity type semiconductor layer 25. The ohmic contact layer 27 may be formed as a single layer or multiple layers. The ohmic contact layer 27 may be formed of a transparent conductive oxide film or a metal film. For example, the transparent conductive oxide layer may include ITO or ZnO, and the metal layer may include metals such as Al, Ti, Cr, Ni and Au, and alloys thereof.

The first contact pad 31 may be disposed on the exposed first conductivity type semiconductor layer 21 in which the mesa M is not formed. The first contact pad 31 may be in ohmic contact with the first conductivity type semiconductor layer 21. The first contact pad 31 may be formed of an ohmic metal layer in ohmic contact with the first conductivity type semiconductor layer 21. The ohmic metal layer of the first contact pad 31 may be appropriately selected depending on a semiconductor material of the first conductivity type semiconductor layer 21.

The second contact pad 33 may be disposed on the ohmic contact layer 27. The second contact pad 33 may be electrically connected to the ohmic contact layer 27.

The insulation layer 29 may cover at least portions of the first conductivity type semiconductor layer 21, the active layer 23, the second conductivity type semiconductor layer 25, the first contact pad 31, and the second contact pad 33. In an exemplary embodiment of the present disclosure, the insulation layer 29 may be formed to cover almost an entire surface of the light emitting device 10a, except for a portion of the second contact pad 33 and a portion of the first contact pad 31. That is, the insulation layer 29 may have a first opening 29a and a second opening 29b exposing the first contact pad 31 and the second contact pad 33. The insulation layer 29 may be formed of a distributed Bragg reflector in which insulation layers having different refractive indices from one another are stacked, and the distributed Bragg reflector may be formed by alternately stacking at least two insulation layers selected from $SiO_2$, $TiO_2$, $Nb_2O_5$, $Si_3N_4$, SiON, $Ta_2O_5$, and the like.

The distributed Bragg reflector may reflect light emitted from the active layer 23, and in this case, the distributed Bragg reflector may be formed to exhibit high reflectance over a relatively wide wavelength range including a peak wavelength of light emitted from the active layer 23. In addition, if necessary, it may be designed in consideration of an incident angle of light. Through this, the distributed Bragg reflector may reflect light generated in the active layer 23 to emit light through the first conductivity type semiconductor layer 21 exposed by removing the growth substrate.

The light emitting device 10c emitting blue light may have higher internal quantum efficiency than those of the light emitting devices 10a and 10b emitting red light and green light. Accordingly, the light emitting device 10c emitting blue light may exhibit higher light extraction efficiency than those of the light emitting devices 10a and 10b emitting red light and green light. As such, it may be difficult to properly maintain a color mixing ratio of red light, green light, and blue light.

To adjust the color mixing ratio of red light, green light, and blue light, the distributed Bragg reflectors applied to the light emitting devices 10a, 10b, and 10c may be formed to have different reflectance from one another. Specifically, the light emitting device 10c emitting blue light may have the distributed Bragg reflector having a relatively low reflectance compared to those of the light emitting devices 10a and 10c emitting red light and green light.

In an exemplary embodiment, the distributed Bragg reflectors applied to the red, green, and blue light emitting devices 10a, 10b, and 10c may have substantially similar thicknesses. By setting the distributed Bragg reflectors to have similar thicknesses, process conditions applied to the respective light emitting devices 10a, 10b, and 10c emitting red light, green light, and blue light may be similarly set. Specifically, a process of patterning the insulation layer 29 may be set similarly, and the distributed Bragg reflectors may have a similar number of stacks. However, the inventive concepts are not limited thereto.

The first electrode pad 41 and the second electrode pad 43 may be disposed on the insulation layer 29. The first electrode pad 41 may extend from an upper portion of the first contact pad 31 to an upper portion of the ohmic contact layer 27 with the insulation layer 29 interposed therebetween. The second electrode pad 43 may be disposed in the upper region of the ohmic contact layer 27. In more detail, the second electrode pad 43 may extend from an upper portion of the second contact pad 33 to the upper portion of the ohmic contact layer 27 with the insulation layer 29 interposed therebetween. The first electrode pad 41 may be electrically connected to the first contact pad 31 through the first opening 29a of the insulation layer 29, and may be directly in contact with the first conductivity type semiconductor layer 21 if necessary. In this case, the first contact pad 31 may be omitted. In other forms, the second electrode pad 43 may be electrically connected to the second contact pad 33 through the second opening 29b of the insulation layer 29, the second electrode pad 43 may be directly in contact with the ohmic contact layer 27, and the second contact pad 33 may be omitted.

Although the light emitting devices 10a, 10b, and 10c according to the exemplary embodiment have been briefly described, the light emitting devices 10a, 10b, and 10c may further include a layer having additional functions in addition to the above-described layers. For example, various layers such as a reflection layer for reflecting light, an additional insulation layer for insulating a specific element, and a solder preventing layer for preventing diffusion of solder may be included in the light emitting devices 10a, 10b, and 10c.

Figure 3A:
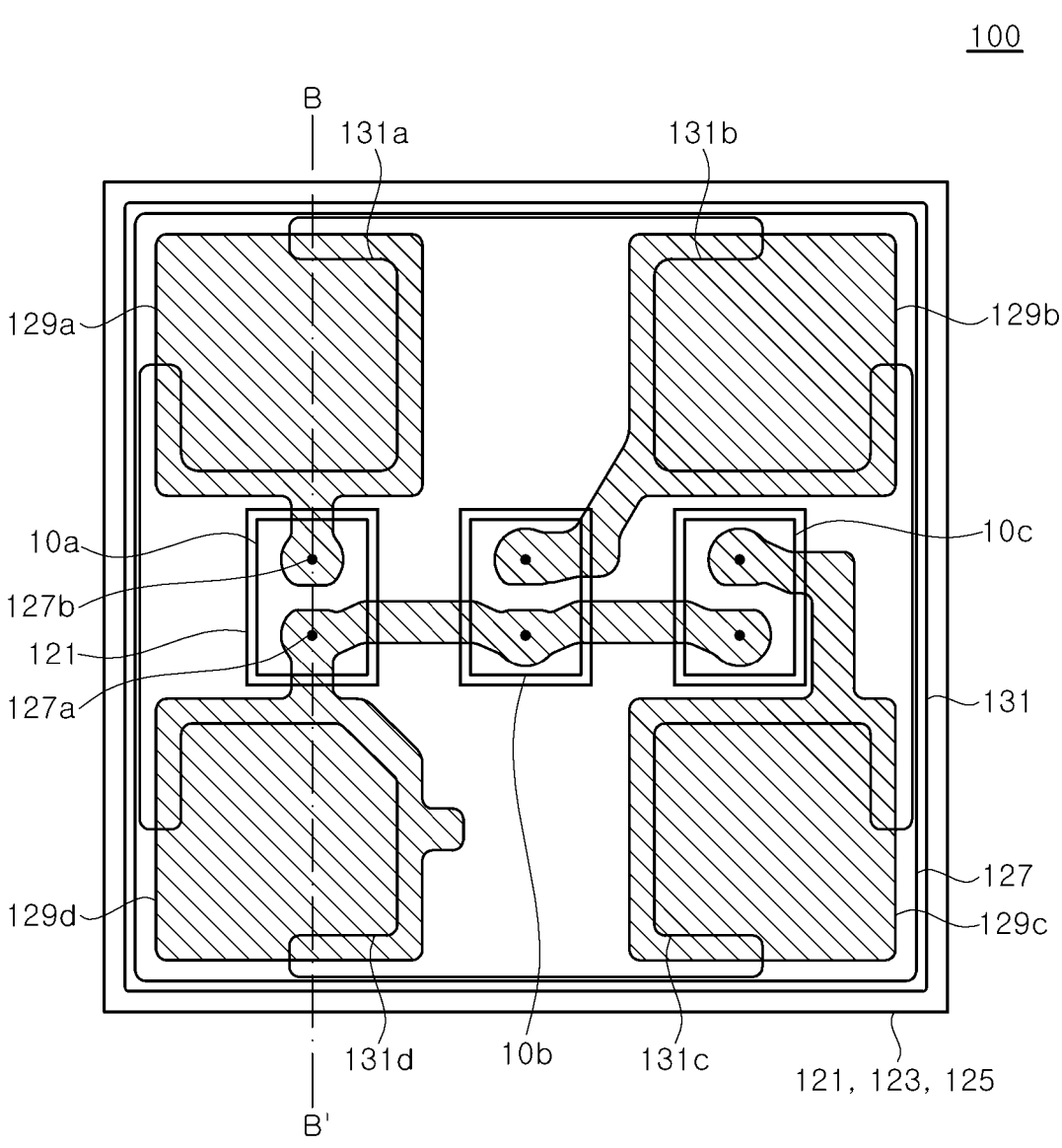
FIG. 3A is a schematic plan view illustrating a unit pixel according to an exemplary embodiment.
Figure 3B:
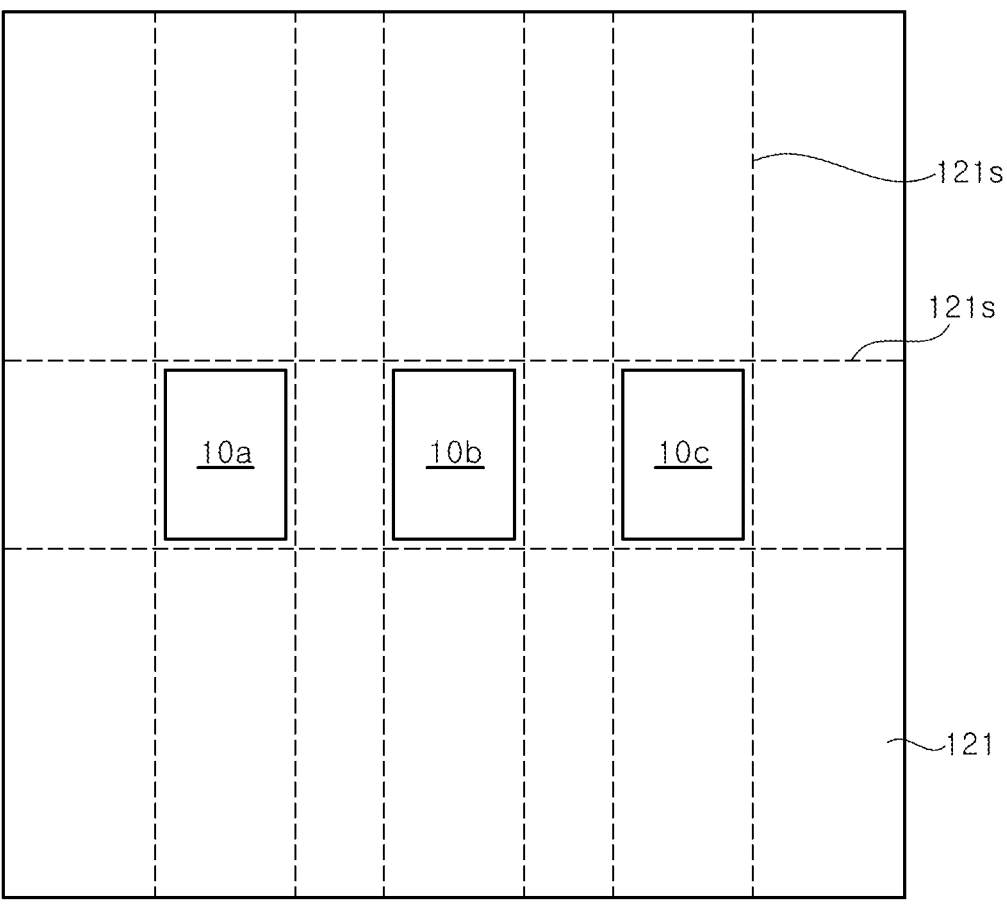
FIG. 3B is a schematic rear view illustrating light scattering lines of a unit pixel according to an exemplary embodiment of the present disclosure.
Figure 3B:
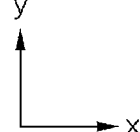
Figure 3C:
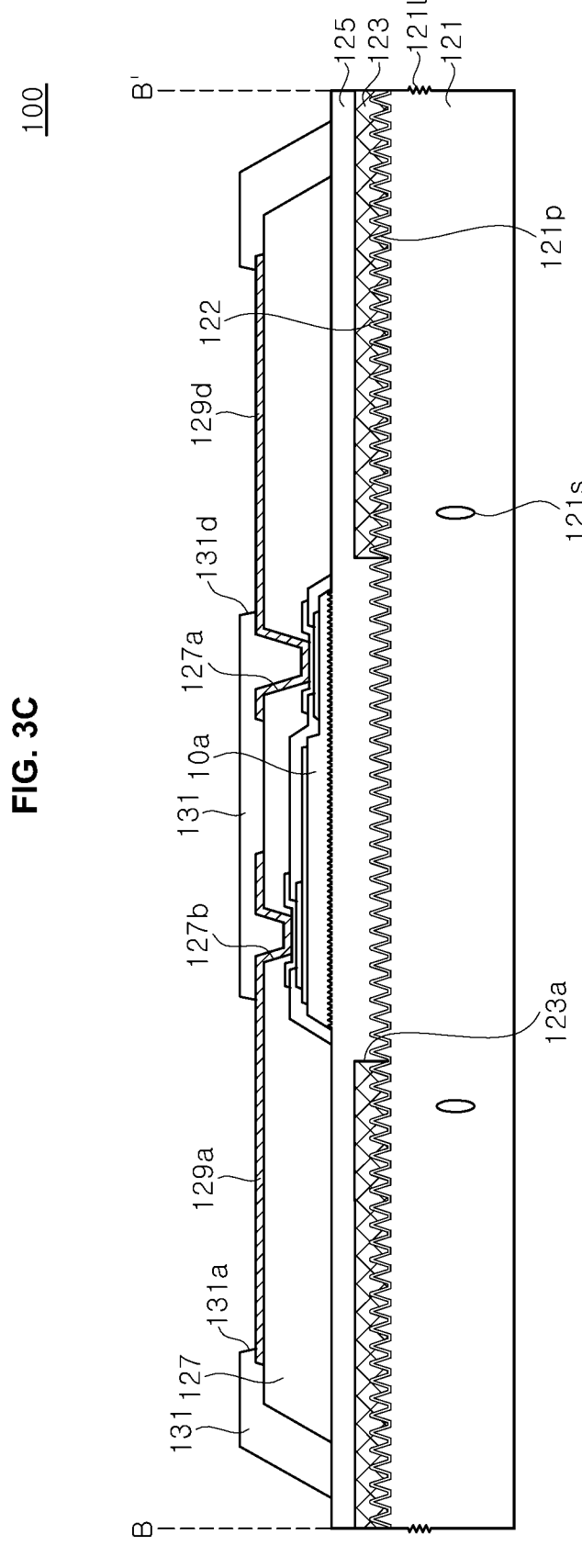
FIG. 3C is a schematic cross-sectional view taken along line B-B' of FIG. 3A.

FIG. 3A is a schematic plan view illustrating a unit pixel according to an exemplary embodiment, FIG. 3B is a schematic rear view illustrating a unit pixel according to an exemplary embodiment, and FIG. 3C is a schematic cross-sectional view taken along line B-B' of FIG. 3A.

Referring to FIGS. 3A, 3B, and 3C, a unit pixel 100 may include a transparent substrate 121, light emitting devices 10a, 10b, and 10c, and a light blocking layer 123. The unit pixel 100 may also include an adhesive layer 125, a step adjustment layer 127, connection layers 129a, 129b, 129c, and 129d, and an insulation material layer 131, and may further include a surface layer 122.

The unit pixel 100 may include at least three light emitting devices 10a, 10b, and 10c. The plurality of light emitting devices 10a, 10b, and 10c may emit light of different colors from one another. The plurality of light emitting devices 10a, 10b, and 10c may emit red light, green light, and blue light, respectively. For example, a peak wavelength of the red light may be 600 nm to 670 nm. A peak wavelength of the green light may be 500 nm to 590 nm. A peak wavelength of the blue light may be 430 nm to 490 nm. As the light emitting devices 10a, 10b, and 10c are the same as those described with reference to FIGS. 2A and 2B, a detailed description thereof will be omitted. The light emitting devices 10a, 10b, and 10c are disposed on the transparent substrate 121.

The transparent substrate 121 may be a light transmissive substrate such as PET, glass substrate, quartz, sapphire substrate, or the like. The transparent substrate 121 may be disposed on a light exiting surface of the displaying apparatus 10000, and light generated from the light emitting device 10a, 10b, and 10c may be emitted to the outside through the transparent substrate 121. The transparent substrate 121 may have a light exiting surface and a light incident surface adjacent to the light emitting devices 10a, 10b, and 10c. The light incident surface of the transparent substrate 121 facing the light emitting devices 10a, 10b, and 10c may be a flat surface, but the inventive concepts are not limited thereto, and as shown in FIG. 3C, the transparent substrate 121 may have a concave-convex pattern 121p on the light incident surface facing the light emitting devices 10a, 10b, and 10c.

The transparent substrate 121 may include an anti-reflection coating on the light exiting surface, or may include an anti-glare layer thereon. The transparent substrate 121 may have a thickness of 30 μm to 300 μm by way of example, and the inventive concepts are not limited thereto.

As light is emitted through the transparent substrate 121 in the exemplary embodiment of the present disclosure, the transparent substrate 121 does not include a circuit. However, the inventive concepts are not limited thereto, and the transparent substrate 121 may include the circuit.

Meanwhile, the transparent substrate 121 may include light scattering lines 121s therein. In the embodiments of the present disclosure, the light scattering lines 121s are described and illustrated in FIG. 3B. Additionally, or alternatively, the present disclosure includes light scattering pattern(s), light scattering line pattern(s), light scattering form(s), light scattering arrangement(s), light scattering configuration(s), etc.

In some forms, the light scattering lines 121s may include voids, as shown in FIG. 3C. The voids may be continuous or spaced apart from one another to form the light scattering line. In some forms, a line of voids corresponds to and forms the light scattering line. As shown in FIG. 3B, the light scattering lines 121s may be orthogonal to one another, and may cover the light emitting devices 10a, 10b, and 10c so as not to overlap with the light emitting devices 10a, 10b, and 10c. The light scattering lines 121s may be disposed so as to correspond to each of the light emitting devices 10a, 10b, and 10c, and may control light viewing patterns of the light emitting devices 10a, 10b, and 10c. In an exemplary embodiment, the light scattering lines 121s of the same shape may be disposed around each of the light emitting devices 10a, 10b, and 10c, but the inventive concepts are not limited thereto. Different shapes of light scattering lines 121s from one another may be disposed according to characteristics of the light emitting devices 10a, 10b, and 10c.

In the exemplary embodiments of the present disclosure, the light scattering lines 121s are for description according to the illustration in FIG. 3B. In other forms, the light scattering lines 121s may include various light scattering patterns. In FIG. 3B, the light scattering lines are shown as dotted lines, and shown in a linear shape, but the inventive concepts are not limited thereto. The light scattering lines may have a non-linear shape, or may be viewed as a three-dimensional shape or pattern.

Further, as shown in FIG. 3B, each of the light scattering lines 121s may extend from one side of the transparent substrate 121 to the other side opposite thereto. However, the inventive concepts are not limited thereto, and the light scattering lines 121s may be disposed in a partial region of the transparent substrate 121 with a length smaller than a width of the transparent substrate 121. In addition, although each of the light scattering lines 121s is illustrated as the straight line in the present exemplary embodiment, the inventive concepts are not limited thereto, and may be a curved line.

As shown in FIG. 3C, a modified region formed by a scribing line 121L may remain on a side surface of the transparent substrate 121. The scribing line 121L may be formed using a stealth laser, and the scribing line 121L may be disposed closer to the light emitting devices 10a, 10b, and 10c than the light scattering line 121s. However, the inventive concepts are not limited thereto, and the scribing line 121L may be disposed farther from the light emitting devices 10a, 10b, and 10c than the light scattering line 121s.

In addition, in the illustrated exemplary embodiment, one unit pixel 100 is illustrated and described as being formed on one transparent substrate 121, but the inventive concepts are not limited thereto, and a plurality of unit pixels 100 may be formed on one transparent substrate 121.

A surface layer 122 may be disposed between the transparent substrate 121 and the light blocking layer 123. The surface layer 122 may be formed to improve adhesion between the light blocking layer 123 and the transparent substrate 121. The surface layer 122 may be formed of, for example, a silicon oxide film ($SiO_2$). The surface layer 122 may be omitted depending on types of the transparent substrate 121 and the light blocking layer 123.

The light blocking layer 123 is disposed between the transparent substrate 121 and the light emitting devices 10a, 10b, and 10c. The light blocking layer 123 may include an inorganic material or an organic material, and may be formed in a black color by adding a dye such as carbon. For example, the light blocking layer 123 may include a material that absorbs light such as a black matrix. The light absorbing material may prevent light generated in the plurality of light emitting devices 10a, 10b, and 10c from being emitted to an undesired region, thereby improving contrast of the displaying apparatus 10000.

The light blocking layer 123 may have a plurality of windows 123a on a path of light so that light generated in the light emitting devices 10a, 10b, and 10c is incident on the transparent substrate 121. In an exemplary embodiment, the windows 123a may be defined as regions in which portions of the light blocking layer 123 are open. The windows 123a may overlap with the light emitting devices 10a, 10b, and 10c at least partially in a vertical direction. In addition, a width of the window 123a may be wider than that of the corresponding light emitting devices 10a, 10b, and 10c, but the inventive concepts are not limited thereto. Alternatively, the width of the window 123a may be smaller than or equal to that of the corresponding light emitting devices 10a, 10b, and 10c.

When the windows 123a overlap the light emitting devices 10a, 10b, and 10c in the vertical direction, the windows 123a may define locations of the light emitting devices 10a, 10b, and 10c, as shown in FIG. 3B. A plurality of windows 123a may be disposed corresponding to the light emitting devices 10a, 10b, and 10c. Since the locations of the light emitting devices 10a, 10b, and 10c are defined by the windows 123a, separate arrangement markers for arranging the light emitting devices 10a, 10b, and 10c may be omitted. However, the inventive concepts are not limited thereto, and an arrangement marker may be provided to arrange the light emitting devices 10a, 10b, and 10c on the transparent substrate 121. The arrangement marker may be formed of, for example, the transparent substrate 121, the light blocking layer 123, or the adhesive layer 125, or a separate layer for generating the arrangement marker may be formed on the transparent substrate 121, the light blocking layer 123, or the adhesive layer 125.

In the illustrated exemplary embodiment, although it is illustrated and described that the plurality of windows 123a is formed to correspond to the light emitting devices 10a, 10b, and 10c, the inventive concepts are not limited thereto. For example, a single window 123a may be provided on the light blocking layer 123, and a plurality of light emitting devices 10a, 10b, and 10c may be disposed to overlap the single window 123a in the vertical direction.

The light blocking layer 123 may have a thickness of, for example, about 0.5 um to about 2 um, further may have a thickness of about 0.5 um to about 1.5 um, and furthermore, may have a thickness of about 0.5 um to about 1 um. When the thickness of the light blocking layer 123 is as small as 0.5 um or less, it is difficult to achieve the purpose of blocking light, and when the thickness of the light blocking layer 123 is 2 μm or more, the unit pixel 100 becomes thick, and production cost may increase as an amount of material used increases.

The light scattering lines 121s may be disposed corresponding to windows 123a. For example, the light scattering lines 121s may pass around the windows 123a, and each of the windows 123a may be covered by a plurality of light scattering lines 121s.

The adhesive layer 125 may be used to attach the light emitting devices 10a, 10b, and 10c to the transparent substrate 121. The adhesive layer 125 may be disposed on the transparent substrate 121, and may cover at least a portion of the light blocking layer 123. The adhesive layer 125 may be formed on an entire surface of the transparent substrate 121, but the inventive concepts are not limited thereto, and, in some exemplary embodiments, the adhesive layer 125 may be formed in a portion of the transparent substrate 121 to expose a region near an edge of the transparent substrate 121. The adhesive layer 125 may fill the windows 123a formed by the light blocking layer 123.

The adhesive layer 125 may be formed of a light-transmitting material, and may transmit light emitted from the light emitting device 10. The adhesive layer 125 may be formed using an organic adhesive, and the adhesive layer 125 may be formed using a transparent epoxy, PDMS, or the like, for example. In addition, the adhesive layer 125 may include a diffuser such as $SiO_2$, $TiO_2$, ZnO, or the like to diffuse light. The light emitting device 10 may be prevented from being observed through the transparent substrate 110.

In the illustrated exemplary embodiment, the light emitting devices 10a, 10b, and 10c are attached to the transparent substrate 121 by the adhesive layer 125, but the inventive concepts are not limited thereto, and the light emitting devices 10a, 10b, and 10c may be coupled to the transparent substrate 121 using another coupling member instead of the adhesive layer 125. For example, the light emitting devices 10a, 10b, and 10c may be coupled to the transparent substrate 121 using a spacer. The spacer may be coated with an organic resin and may have a predetermined shape, generally a pillar or columnar shape. Accordingly, a gas or liquid may be filled in a region between the light emitting devices 10a, 10b, and 10c and the transparent substrate 121. An optical layer that transmits light emitted from the light emitting devices 10a, 10b, and 10c may be formed by gas or liquid.

The step adjustment layer 127 may cover at least a portion of the light emitting devices 10a, 10b, and 10c, as shown in FIG. 3C. The step adjustment layer 127 has first and second openings 127a and 127b exposing first and second electrode pads 41 and 43 of the light emitting devices 10a, 10b, and 10c. The step adjustment layer 127 may adjust a height of a surface on which the connection layers 129a, 129b, 129c, and 129d are formed and may assist to safely form the connection layers 129a, 129b, 129c, and 129d. The step adjustment layer 127 may be formed of, for example, photosensitive polyimide.

The first, second, third, and fourth connection layers 129a, 129b, 129c, and 129d are electrically connected to the plurality of light emitting devices 10a, 10b, and 10c, as shown in FIG. 3A. The first, second, and third connection layers 129a, 129b, and 129c may be electrically connected to second conductivity type semiconductor layers 25 of the light emitting devices 10a, 10b, and 10c, respectively. The fourth connection layer 129d may be commonly electrically connected to first conductivity type semiconductor layer 21 of the plurality of light emitting devices 10a, 10b, and 10c. Specifically, the first, second, and third connection layers 129a, 129b, and 129c may be connected to the second electrode pad 43 of the plurality of light emitting devices 10a, 10b, and 10c through the second opening 127b of the step adjustment layer 127. In addition, the fourth connection layer 129d may be connected to the first electrode pad 41 of the plurality of light emitting devices 10a, 10b, and 10c through the first opening 127a of the step adjustment layer 127, as illustrated in FIG. 3C.

The first, second, third, and fourth connection layers 129a, 129b, 129c, and 129d may be formed together on the step adjustment layer 127, and may include, for example, Au. Although the first conductivity type semiconductor layers 21 of the light emitting devices 10a, 10b, and 10c are commonly electrically connected in the illustrated exemplary embodiment, the inventive concepts are not limited thereto. The second conductivity type semiconductor layers 25 of the light emitting devices 10a, 10b, and 10c may be commonly electrically connected, and the first conductivity type semiconductor layers 21 may be electrically spaced apart from one another.

The insulation material layer 131 may at least partially cover the step adjustment layer 127. The insulation material layer 131 may be formed to have a thickness smaller than that of the step adjustment layer 127. A sum of the thicknesses of the insulation material layer 131 and the step adjustment layer 127 may be about 1 µm to about 50 µm, but the inventive concepts are not limited thereto.

The insulation material layer 131 may cover side surfaces of the step adjustment layer 127 and at least a portion of the connection layers 129a, 129b, 129c, and 129d, as shown in FIG. 3A. The insulation material layer 131 has openings 131a, 131b, 131c, and 131d exposing the connection layers 129a, 129b, 129c, and 129d in FIG. 3A. The openings 131a, 131b, 131c, and 131d may be partially formed on the connection layers 129a, 129b, 129c, and 129d, but the inventive concepts are not limited thereto. As illustrated in FIG. 3A, the openings 131a, 131b, 131c, and 131d may have a shape open to the outside in regions adjacent to each corner of the transparent substrate 121. That is, the insulation material layer 131 may be formed to expose the side surfaces of the step adjustment layer 127 and the connection layers 129a, 129b, 129c, and 129d near the corners of the transparent substrate 121. As illustrated in FIG. 3A, the insulation material layer 131 may partially cover two side surfaces of each of the connection layers 129a, 129b, 129c and 129d disposed near the corner of the transparent substrate 121, and may cover the remaining two side surfaces.

In addition, when the adhesive layer 125 is exposed to the outside of the step adjustment layer 127, the insulation material layer 131 may at least partially cover the exposed adhesive layer 125. Pad regions of the unit pixel 100 may be defined by the openings 131a, 131b, 131c, and 131d of the insulation material layer 131 exposing the connection layers 129a, 129b, 129c, and 129d.

The insulation material layer 131 may be a translucent material, and may be formed of an organic or inorganic material, which, for example, may be formed of various materials such as epoxy, polyimide, $SiO_2$, SiNx, and others. When the insulation material layer 131 along with the step adjustment layer 127 is formed of polyimide, all of lower surfaces, side surfaces, and at least portions of upper surfaces of the connection layers 129a, 129b, 129c, and 129d may be surrounded by the polyimide, except for the pad regions.

The insulation material layer 131 may prevent a defect from occurring in the unit pixel 100 while the unit pixel 100 is being transferred.

Meanwhile, the unit pixel 100 may be mounted on a circuit board using a bonding material such as solder, and the bonding material may bond the connection layers 129a, 129b, 129c, and 129d exposed to the openings 131a, 131b, 131c, and 131d of the insulation material layer 131 to pads on the circuit board.

Figure 4:
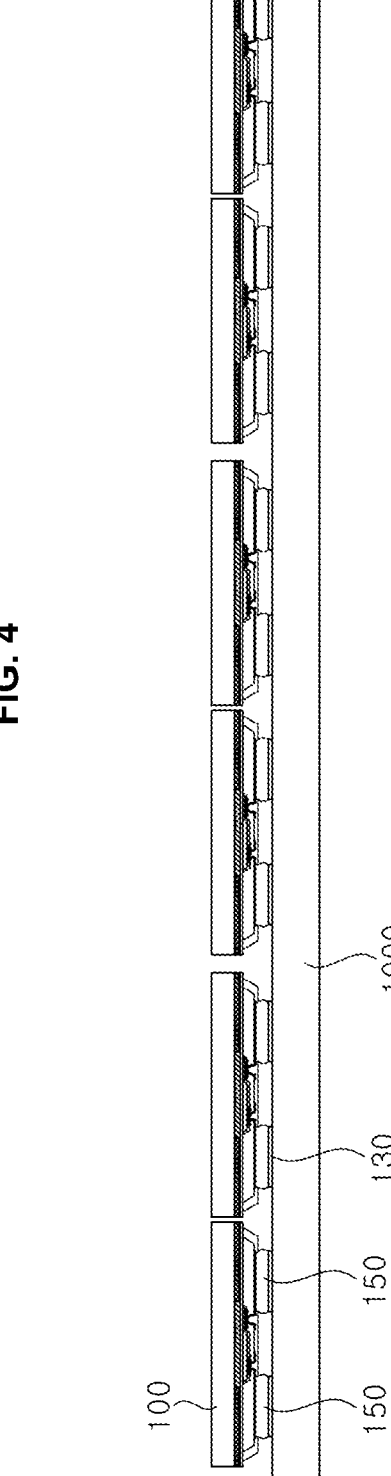
FIG. 4 is a schematic cross-sectional view illustrating a displaying apparatus according to an exemplary embodiment.

FIG. 4 is a schematic cross-sectional view illustrating a displaying apparatus on which the unit pixel 100 is mounted.

Referring to FIG. 4, the unit pixels 100 are mounted on a panel substrate 1000 using a bonding material 150. The panel substrate 1000 may be replaced with a circuit board.

The connection layers 129a, 129b, 129c, and 129d exposed through the openings 131a, 131b, 131c, and 131d of the insulation material layer 131 may be bonded to the pads 130 on the panel substrate 1000 through the bonding material 150. However, the inventive concepts are not limited thereto, and eutectic bonding, epoxy bonding, or the like may be used.

The bonding material 150 may be solder for example, and after a solder paste is disposed on the pad 130 using a technology such as screen printing, the unit pixel 100 and the circuit board may be bonded through a reflow process.

As described with reference to FIG. 1, the panel substrate 1000 may be formed of a material such as polyimide I), FR-4 glass epoxy (FR4), glass, or the like, and may include a circuit for passive matrix driving or active matrix driving. In an exemplary embodiment of the present disclosure, the panel substrate 1000 may include wirings and resistors therein, and, in another exemplary embodiment, the panel substrate 1000 may include wirings, transistors, and capacitors. In addition, the panel substrate 1000 may have pads on an upper surface thereof, which allow electrical connection to the circuit. The pads may be arranged to correspond to the connection layers 129a, 129b, 129c, and 129d in the unit pixels 100 to be mounted on the pad. In addition, a molding member may be formed on the panel substrate 1000 on which the plurality of unit pixels 100 is mounted so as to improve a contrast ratio.

Figure 5:
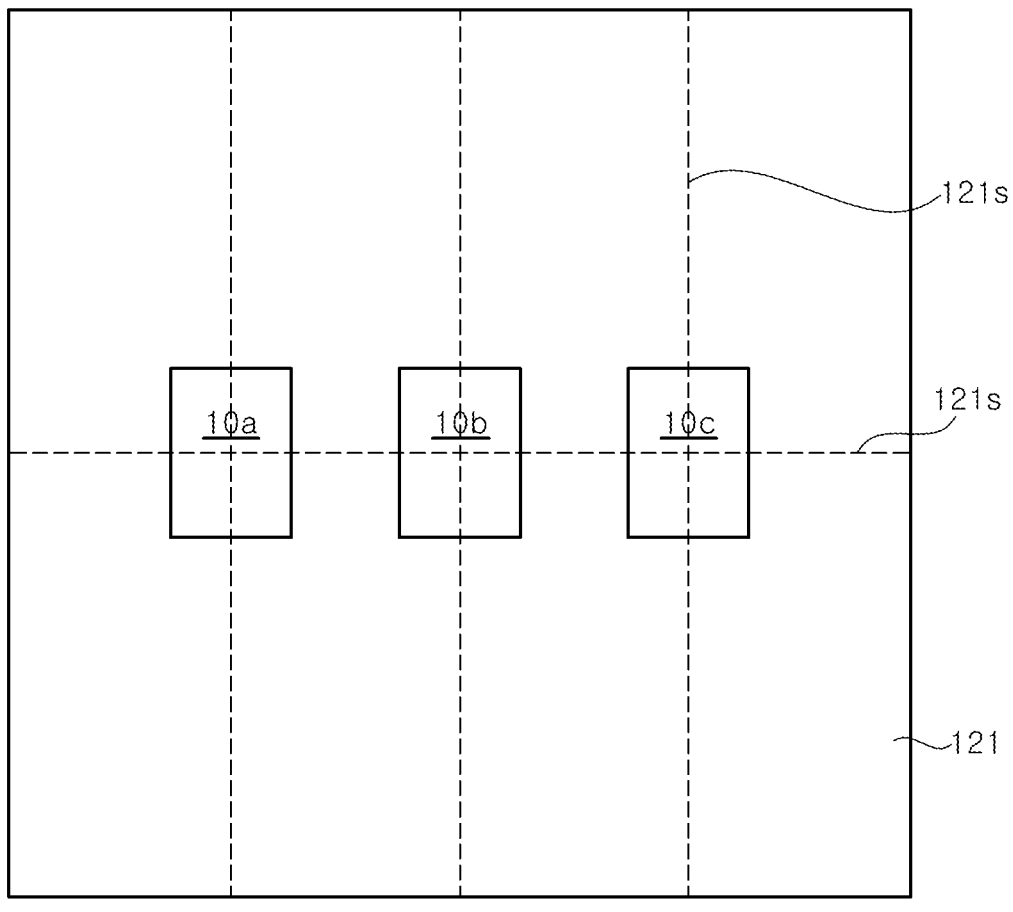
FIG. 5 is a schematic rear view illustrating light scattering lines of a unit pixel according to another exemplary embodiment.
Figure 5:
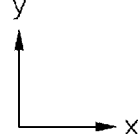

FIG. 5 is a schematic rear view illustrating a unit pixel according to another exemplary embodiment.

Referring to FIG. 5, the unit pixel according to the illustrated exemplary embodiment is substantially similar to the unit pixel 100 described with reference to FIGS. 3A, 3B, and 3C, except that light scattering lines 121s are disposed so as to overlap light emitting devices 10a, 10b, and 10c. The light scattering lines 121s may include a light scattering line crossing a plurality of light emitting devices 10a, 10b, and 10c and light scattering lines crossing each of the light emitting devices 10a, 10b, and 10c. As shown in FIG. 5, the light scattering lines may be orthogonal to one another.

In the illustrated exemplary embodiment, it is illustrated and described that two light scattering lines 121s are disposed so as to be orthogonal to one another on each of the light emitting devices 10a, 10b, and 10c, but the inventive concepts are not limited thereto. A larger number of light scattering lines 121s may be disposed so as to overlap each of the light emitting devices 10a, 10b, and 10c. In addition, two light scattering lines 121s may intersect without being orthogonal to one another on each of the light emitting devices 10a, 10b, and 10c.

Figure 6:
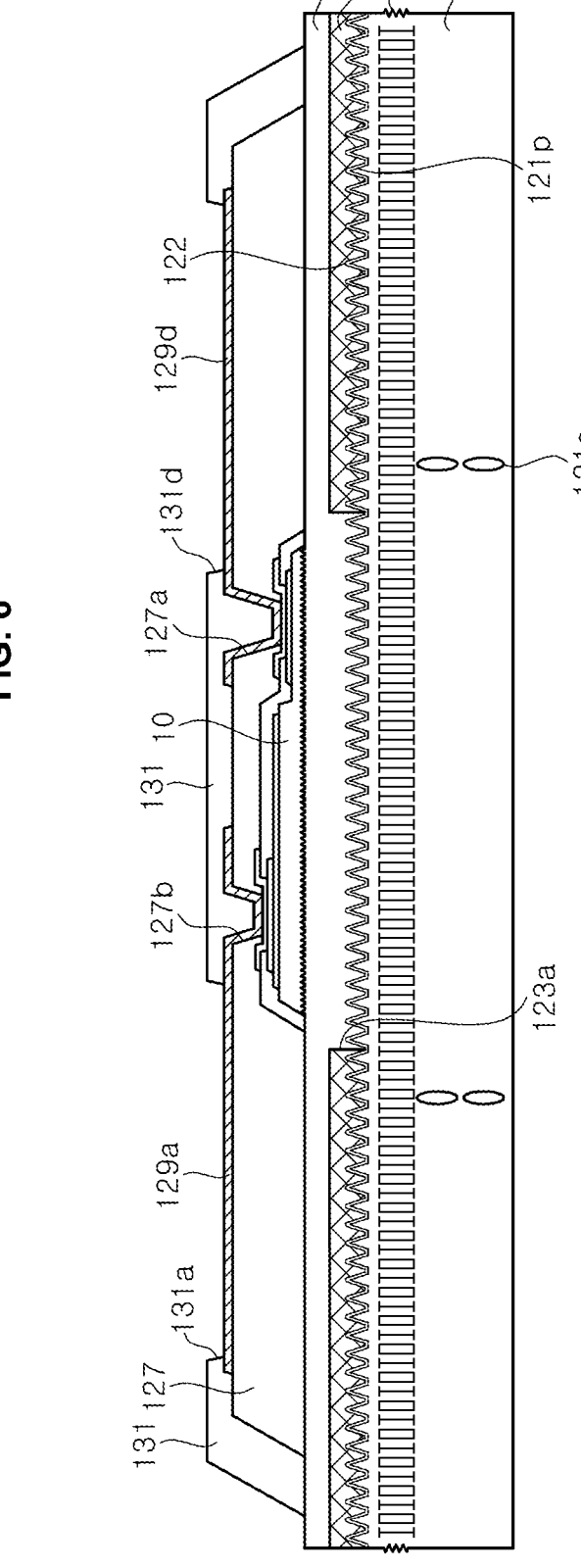
FIG. 6 is a schematic cross-sectional view illustrating a unit pixel according to another exemplary embodiment.

FIG. 6 is a schematic cross-sectional view illustrating a unit pixel according to another exemplary embodiment.

Referring to 6, the unit pixel according to the illustrated exemplary embodiment is substantially similar to the unit pixel 100 described with reference to FIGS. 3A, 3B, and 3C, except that light scattering lines 121s are disposed so as to overlap one another also in a vertical direction. That is, the light scattering lines 121s including voids may overlap in a thickness direction of a transparent substrate 121, and thus, light viewing patterns of the light emitting devices 10a, 10b, and 10c may be made more uniform. In FIG. 6, the transparent substrate 121 may include modified regions formed on side surfaces of the transparent substrate 121 by a scribing lines 121L formed using a stealth laser. In FIG. 6, an example of the modified region formed by the scribing line 121L is projected and shown together in a cross-sectional view. The scribing line 121L may be disposed closer to the light emitting devices 10a, 10b, and 10c than the light scattering lines 121s, but the inventive concepts are not limited thereto.

Figure 7:
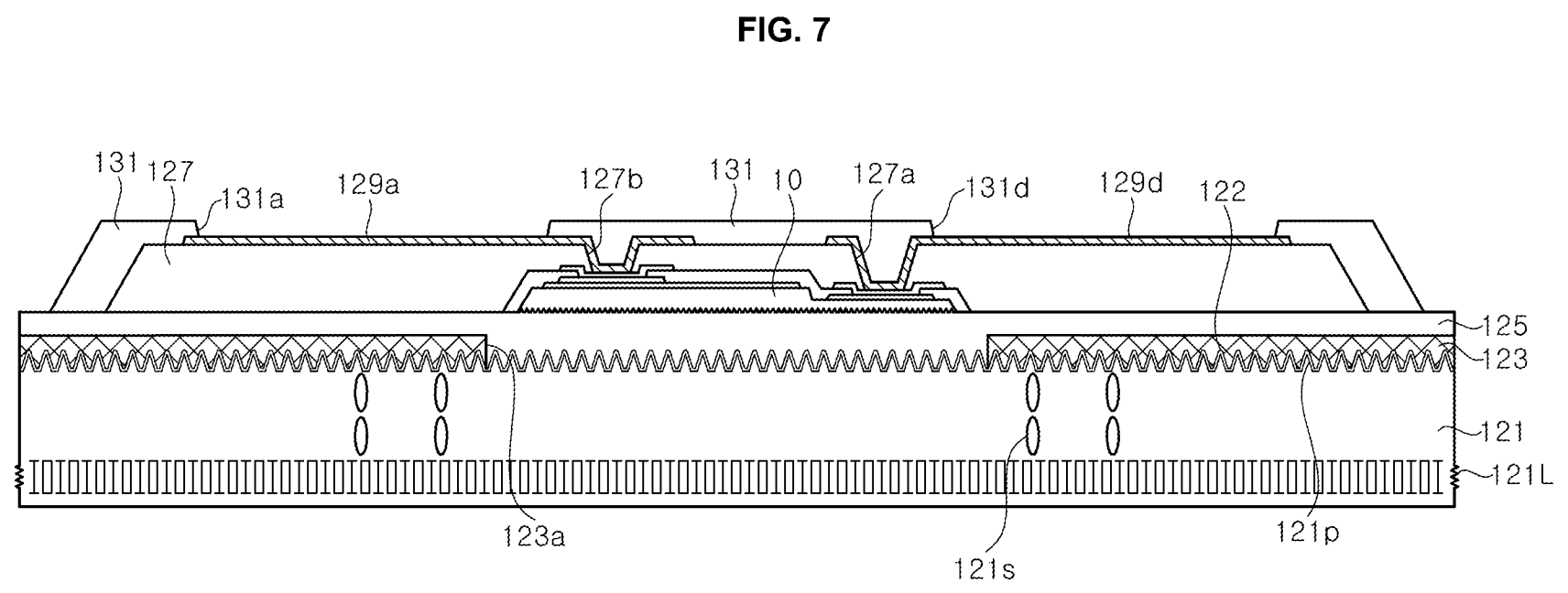

FIG. 7 is a schematic cross-sectional view illustrating a unit pixel according to another exemplary embodiment.

Referring to FIG. 7, the unit pixel according to the illustrated exemplary embodiment is substantially similar to the unit pixel described with reference to FIG. 6, except that light scattering lines 121s are arranged in double. By disposing the light scattering lines 121s double, more light may be scattered, and thus, light viewing patterns of light emitting devices 10a, 10b, and 10c may be further controlled. Meanwhile, in FIG. 7, a transparent substrate 121 may include modified regions formed on side surfaces of the transparent substrate 121 by a scribing line 121L formed using a stealth laser. In FIG. 7, an example of the modified region formed by the scribing line 121L is projected and shown together in a cross-sectional view. The scribing line 121L may be disposed farther from the light emitting devices 10a, 10b, and 10c than the light scattering lines 121s, but the inventive concepts are not limited thereto.

Figure 8:
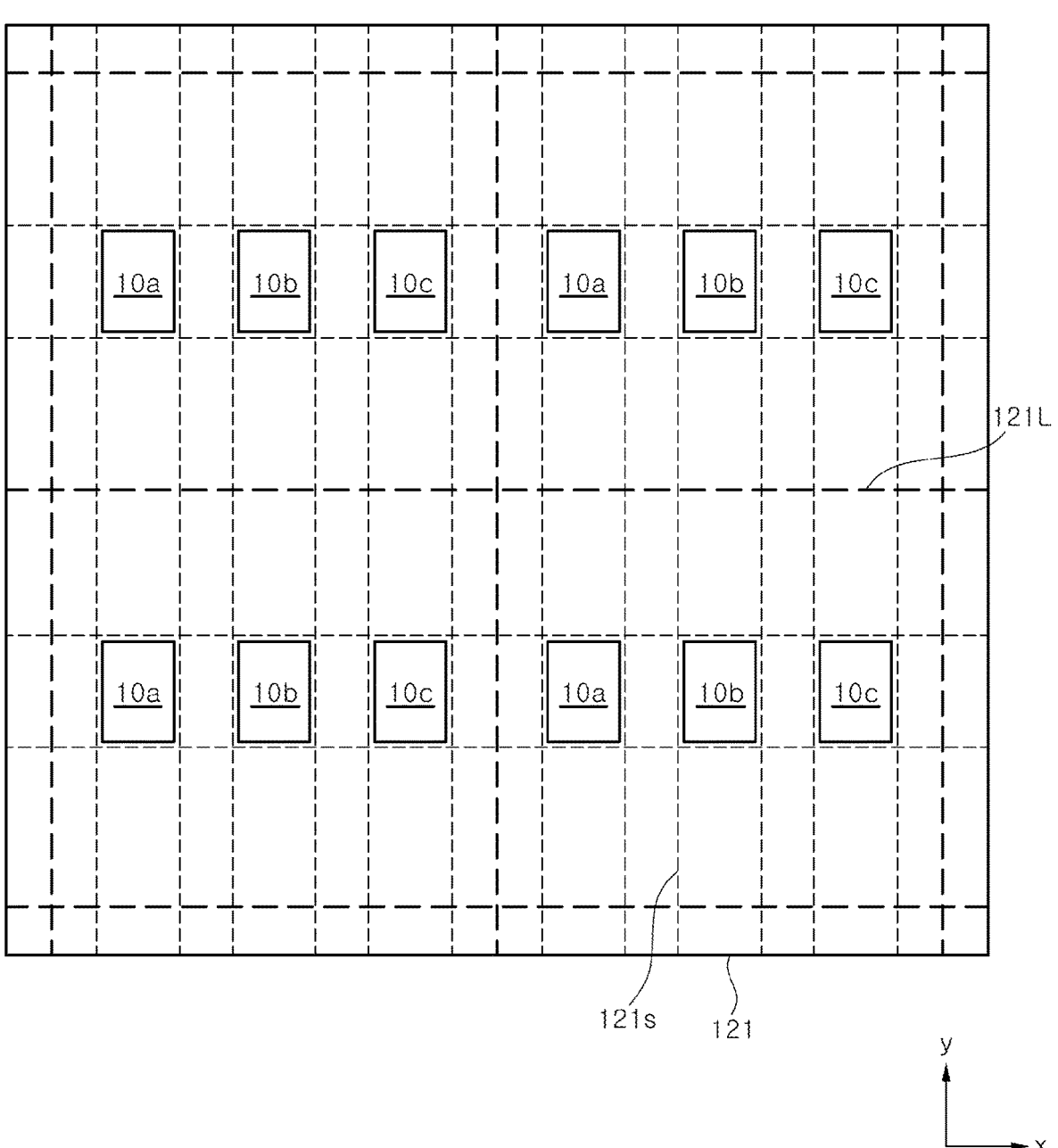
FIG. 8 is a schematic diagram illustrating a method of manufacturing a unit pixel according to an exemplary embodiment.

FIG. 8 is a schematic diagram illustrating a method of manufacturing a unit pixel according to an exemplary embodiment.

The unit pixel is manufactured by cutting a transparent substrate 121 having a plurality of pixel regions into individual pixel regions. Before cutting the transparent substrate 121, a light blocking layer 123 and an adhesive layer 125 as described with reference to FIGS. 3A, 3B, and 3C are formed in each pixel region, light emitting devices 10a, 10b, and 10c are mounted on the transparent substrate 121 using the adhesive layer 125, and a step adjustment layer 127, first, second, third, and fourth connection layers 129a, 129b, 129c, and 129d, and an insulation material layer 131 are formed.

Meanwhile, scribing lines 121L are formed inside the transparent substrate 121 using a stealth laser. Thereafter, the unit pixels are separated from one another by cracking the transparent substrate 121 along the scribing lines 121L. Regions formed by the scribing lines 121L may remain on a side surface of the transparent substrate 121 of the separated unit pixel.

Meanwhile, in the illustrated exemplary embodiment, before cracking the transparent substrate 121, light scattering lines 121s may be formed inside the transparent substrate 121. The light scattering lines 121s may be formed using the stealth laser that is used to form the scribing line 121L. The light scattering lines 121s may be formed using, for example, a stealth laser having a wavelength of about 1000 nm to about 1200 nm, and may be formed lower or deeper than a location where the scribing line 121L is formed in the transparent substrate 121 (see FIG. 6). Meanwhile, end portions of the light scattering lines 121s may be observed together with a modified region remaining by the scribing line 121L. The scribing lines 121L are formed on a side surface of the transparent substrate 121 which is cracked by the scribing line 121L (See FIG. 3C). The scribing lines 121L and the light scattering lines 121s may be formed while moving a stage on which the transparent substrate 121 is placed, and, thus, may be formed in a linear shape. Since voids formed in the light scattering lines 121s are formed while moving the stage, the voids may be formed in a direction inclined with respect to a vertical direction of the transparent substrate 121, and may have an elongated shape. The light scattering lines 121s may be continuous or may be formed of discontinuous voids, and voids of the light scattering lines 121s generally have vertical lengths smaller than vertical lengths of voids formed in the scribing line 121L. In addition, a moving speed of the stage when forming the light scattering lines 121s may be faster than that of the stage when forming the scribing lines 121L, and thus, an interval between the voids of the light scattering lines 121s may be greater than that between the voids of the scribing lines 121L. Moreover, due to different laser irradiation conditions as well as the speed of the stage, the voids remaining in the light scattering lines 121s may have shapes different from those of the scribing lines 121L in the modified regions. Meanwhile, in the illustrated exemplary embodiment, it has been illustrated and described that the light scattering lines 121*s* are formed in the linear shape, but the inventive concepts are not limited thereto, and the light scattering lines 121*s* may be formed in a curved shape.

The light scattering lines 121*s* may be formed first and then the scribing lines 121L may be formed. Alternatively, the scribing lines 121L may be formed first and then the light scattering lines 121*s* may be formed. Further alternatively, the scribing lines 121L and the light scattering lines 121*s* may be alternately formed.

Figure 9:
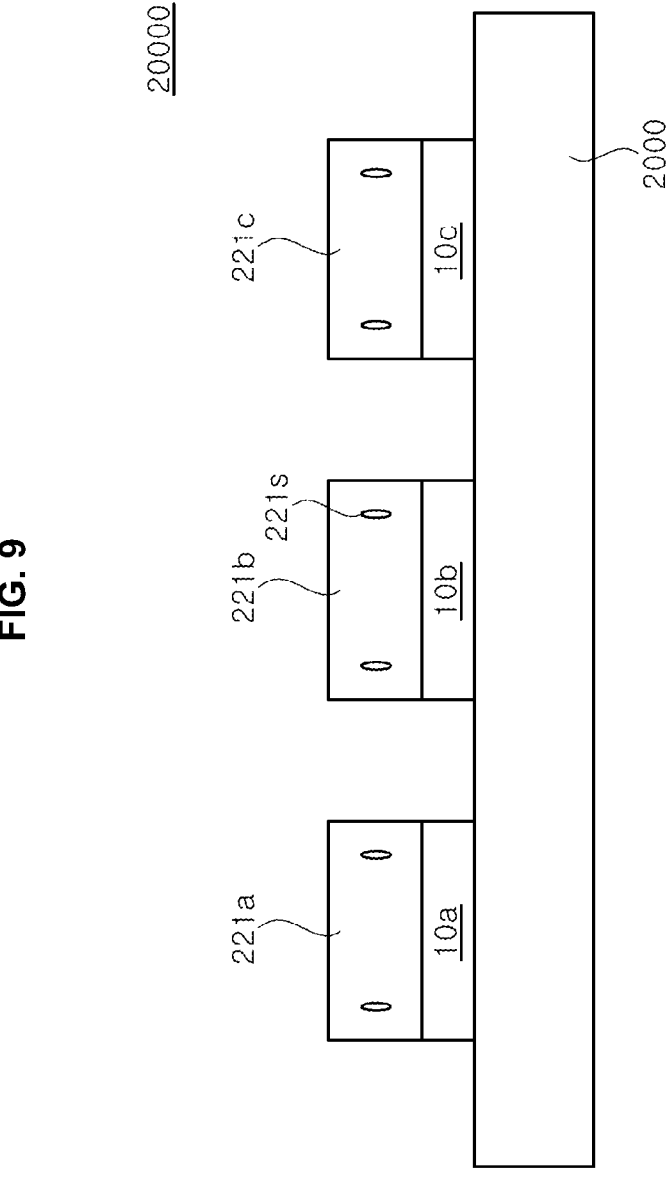
FIG. 9 is a schematic cross-sectional view illustrating a displaying apparatus according to another exemplary embodiment.

FIG. 9 is a schematic cross-sectional view illustrating a displaying apparatus 20000 according to another exemplary embodiment.

The displaying apparatus 10000 in the above-described embodiments includes the unit pixel 100 on which the plurality of light emitting devices 10*a*, 10*b*, and 10*c* is mounted, but in the displaying apparatus 20000 according to the illustrated exemplary embodiment, sub-pixels are disposed on a circuit board 2000, respectively, and a plurality of sub-pixels is grouped and constitutes a unit pixel.

The circuit board 2000 is the same as the circuit board 1000 described with reference to FIG. 1, and a detailed description thereof will be omitted.

Meanwhile, the sub-pixels include light emitting devices 10*a*, 10*b*, and 10*c* and transparent substrates 221*a*, 221*b*, and 221*c*. The transparent substrates 221*a*, 221*b*, and 221*c* may be disposed on the light emitting devices 10*a*, 10*b*, and 10*c*, respectively.

Since the light emitting devices 10*a*, 10*b*, and 10*c* are similar to those described with reference to FIGS. 2A and 2B, detailed descriptions thereof will be omitted. Meanwhile, the transparent substrates 221*a*, 221*b*, and 221*c* may be growth substrates for growing the light emitting devices 10*a*, 10*b*, and 10*c*, respectively, but the inventive concepts are not limited thereto.

Light scattering lines 221*s* may be formed in the transparent substrates 221*a*, 221*b*, and 221*c*. The light scattering lines 221*s* may be formed in the transparent substrates 221*a*, 221*b*, and 221*c* in various shapes.

Figure 10A:
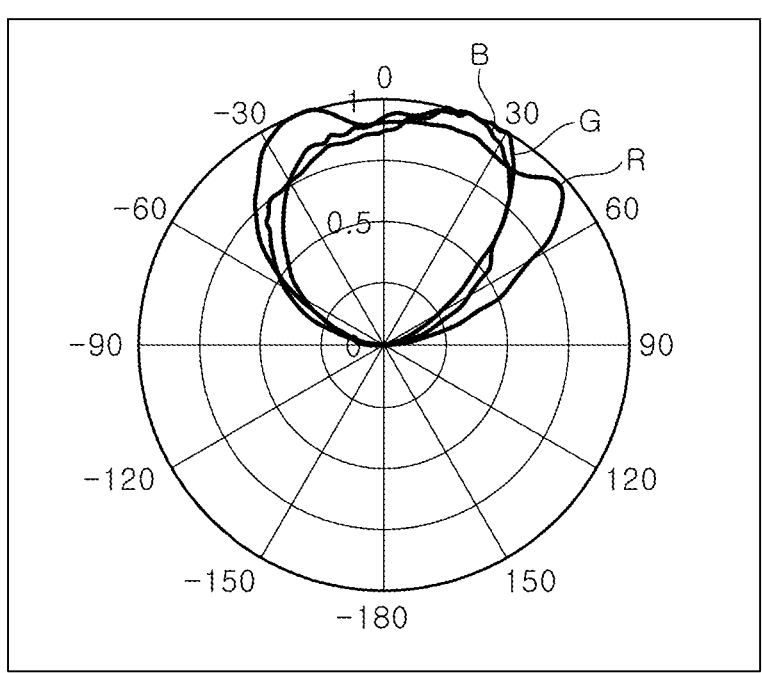
FIGS. 10A and FIG. 10B are graphs showing light viewing patterns of light emitting devices in a unit pixel according to the related art, where.
Figure 10B:
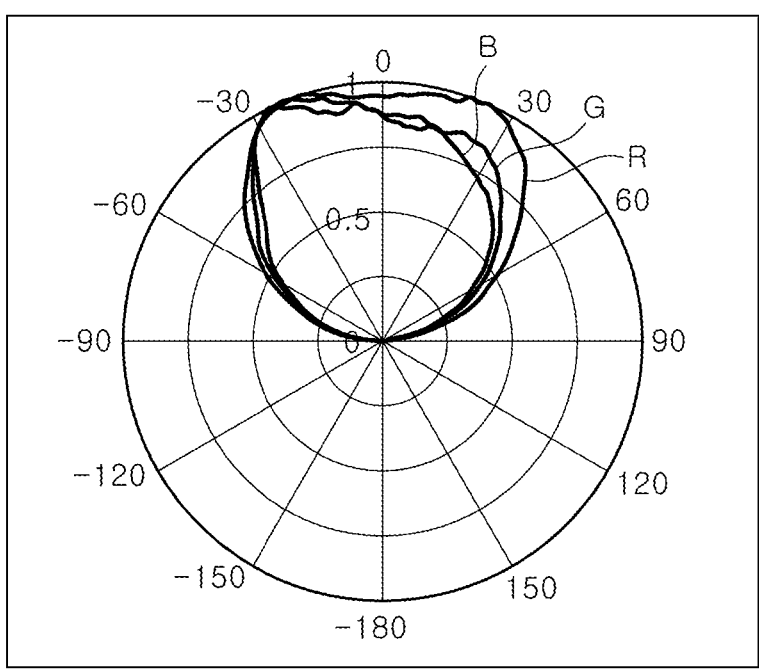

FIGS. 10A and 10B are graphs showing light viewing patterns of light emitting devices in a unit pixel according to the related art. FIG. 10A is a graph scanned in the x-direction of FIG. 3B, and FIG. 10B is a graph scanned in the y-direction of FIG. 3B.

Referring to FIGS. 10A and 10B, it can be seen that a light viewing pattern R, a light viewing pattern G, and a light viewing pattern B of the light emitting devices in FIG. 10A are respectively different from one another and inconsistent (not overlap) in both the x-direction and the y-direction. Likewise, in FIG. 10B, each light viewing pattern R, G, and B of the light emitting devices are also different from one another and inconsistent (not overlap) in both the x-direction and the y-direction. There may be a higher level of inconsistencies among the light viewing patterns R, G, B in FIG. 10A than a level of inconsistencies among the light viewing patterns R, G, B in FIG. 10B. The light viewing patterns R, G, and B of the light emitting devices in FIGS. 10A and 10B will be described more in detail below in connection with FIGS. 11A and 11B and FIGS. 12A and 12B.

Figure 11A:
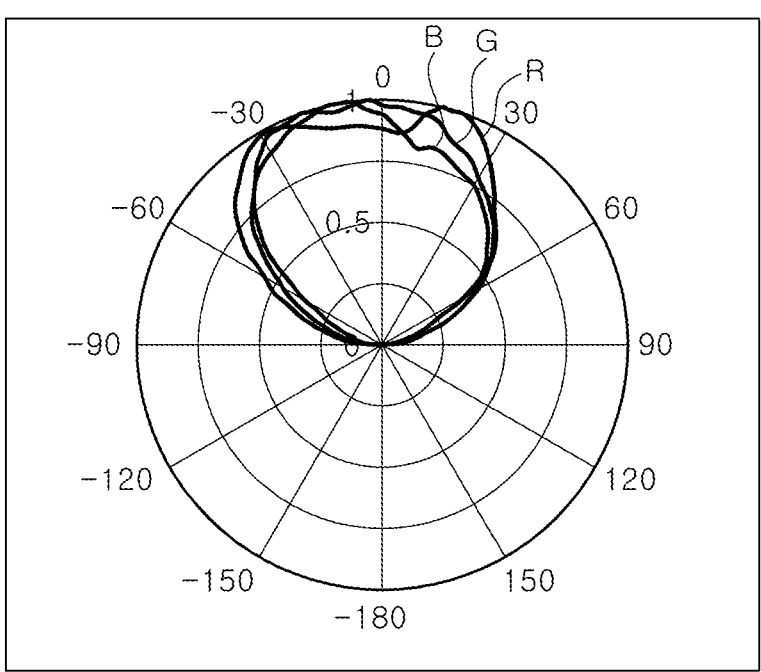
FIGS. 11A and FIG. 11B are graphs showing light viewing patterns of light emitting devices in a unit pixel according to an exemplary embodiment of the present disclosure, where.
Figure 11B:
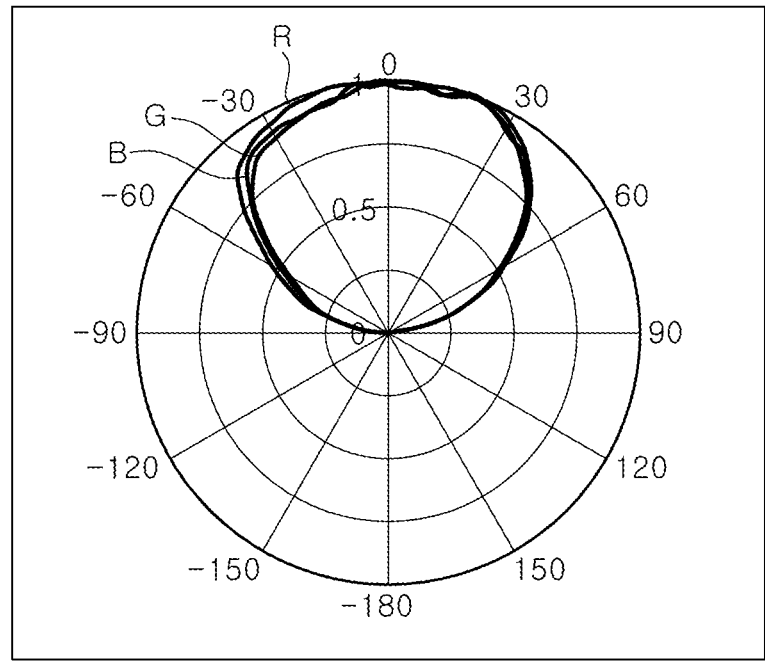

FIGS. 11A and 11B are graphs showing light viewing patterns of light emitting devices in a unit pixel according to an exemplary embodiment of the present disclosure. The unit pixel according to the illustrated exemplary embodiment is the same as a unit pixel according to the related art, except that the light scattering lines 121*s* as described with reference to FIG. 3B are formed in the transparent substrate 121. FIG. 11A is a graph scanned in the x-direction of FIG. 3B, and FIG. 11B is a graph scanned in the y-direction of FIG. 3B.

Referring to FIGS. 11A and 11B, it can be seen that light viewing patterns R, G, and B of the light emitting devices in both the x and y directions are relatively more consistent than those of FIGS. 10A and 10B.

Figure 12A:
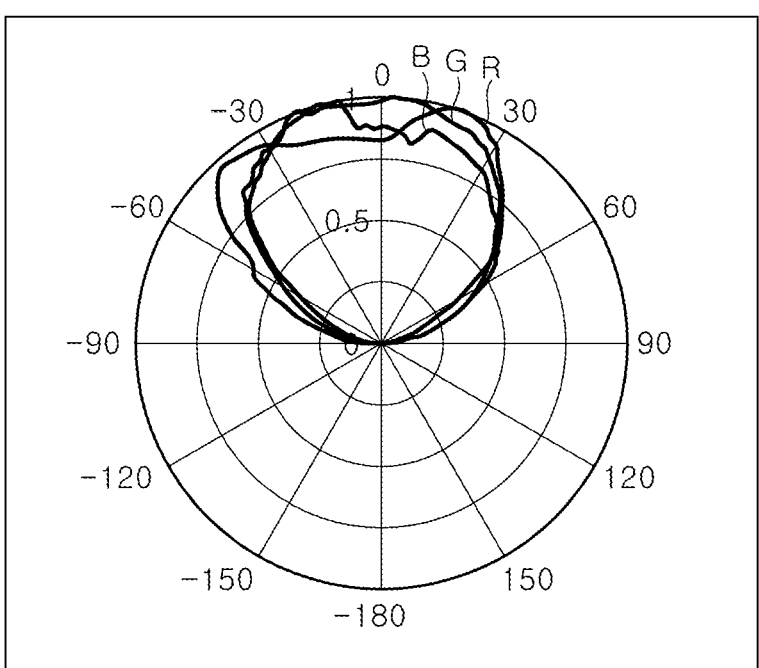
FIGS. 12A and FIG. 12B are graphs showing light viewing patterns of light emitting devices in a unit pixel according to another embodiment of the present disclosure, where.
Figure 12B:
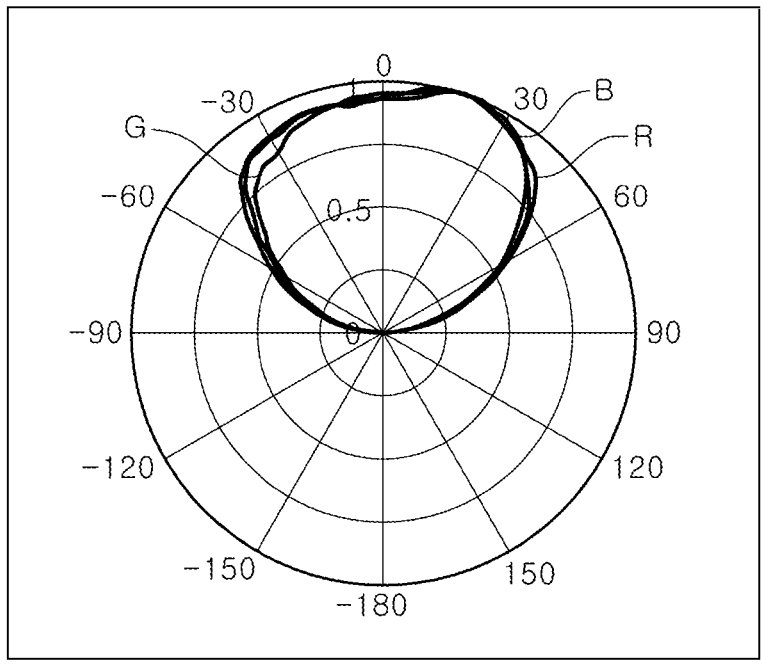

FIG. 12A and FIG. 12B are graphs showing light viewing patterns of light emitting devices in a unit pixel according to another embodiment of the present disclosure. The unit pixel according to the present embodiment is the same as a unit pixel according to a prior art, except that the light scattering lines 121*s* as described with reference to FIG. 5 are formed in the transparent substrate 121.

Referring to FIGS. 12A and 12B, it can be seen that light viewing patterns R, G, and B of the light emitting devices in both the x and y directions are relatively more consistent than those of FIGS. 10A and 10B.

FIGS. 13A through 13F show schematic plan views illustrating various exemplary embodiments of the present disclosure.

Figure 13A:
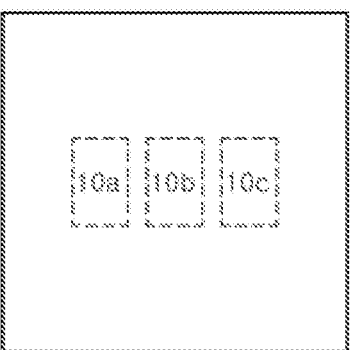
FIGS. 13A through 13F show schematic plan views illustrating light scattering lines or patterns according to various exemplary embodiments of the present disclosure, where.
Figure 13B:
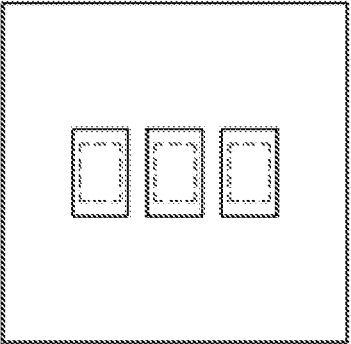

Referring to FIGS. 13A through 13F, light scattering lines may be disposed at various locations and in various shapes around light emitting devices 10*a*, 10*b*, and 10*c*. For example, as shown in FIG. 13A, the light scattering lines may be disposed in a rectangular shape so as to define same areas as those of the light emitting devices 10*a*, 10*b*, and 10*c* along edges of the light emitting devices 10*a*, 10*b*, and 10*c*. As shown in as shown in FIG. 13B, the light scattering lines may be disposed in the rectangular shape so as to define areas smaller than those of the light emitting devices 10*a*, 10*b*, and 10*c*. In addition, the light scattering lines may be disposed so as to define larger areas than those of the light emitting devices 10*a*, 10*b*, and 10*c*.

Figure 13C:
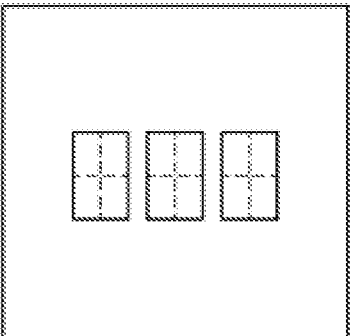
Figure 13D:
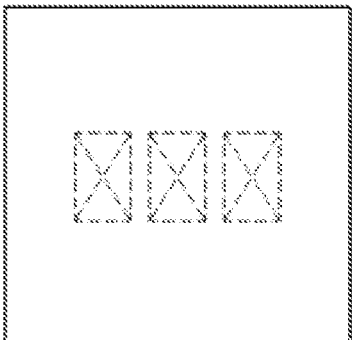
Figure 13E:
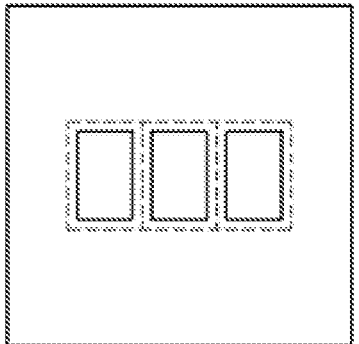
Figure 13F:
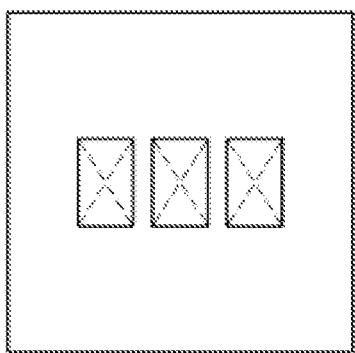

Additionally, or alternatively, the light scattering lines may be disposed to cross each of the light emitting devices 10*a*, 10*b*, and 10*c* in a vertical direction as shown in FIG. 13C, or may be disposed to cross each of them in a diagonal direction as shown in FIG. 13D. FIG. 13E illustrates light scattering lines disposed so as to define larger areas than those of the light emitting devices. Further, the rectangles defined by the light scattering lines may be disposed so as to contact one another, as shown in FIG. 13E. In addition, the light scattering lines disposed in the rectangular shape and those crossing the light emitting devices in the diagonal direction may be disposed overlapping with one another, as shown in FIG. 13F.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

The invention claimed is:

1. A unit pixel comprising:
   a transparent substrate formed of a single layer of transmissive material and including a light incident surface and a light exiting surface; and
   a plurality of light emitting devices arranged on the transparent substrate and operable to emit light of different colors from one another;
   wherein the light generated from the plurality of light emitting devices enters via the light incident surface of the transparent substrate and exits the transparent substrate through the light exiting surface;

at least one light scattering line located within the transparent substrate, spaced from the light incident and light exiting surfaces, and corresponding to one or more of the plurality of light emitting devices in a predetermined pattern, wherein each of the at least one light scattering line comprises a continuous elongate void within the transparent substrate having a length that is at least as long as a lateral dimension of each of the corresponding one or more of the plurality of light emitting devices; and a light blocking layer disposed between the transparent substrate and the plurality of light emitting devices arranged on a coplanar surface, wherein: the light blocking layer has at least one window configured to pass the light generated from the plurality of the light emitting devices, and the at least one light scattering line is disposed so as to correspond to the at least one window.

2. The unit pixel of claim 1, wherein the length of the continuous void is at least as long as a length of each of the corresponding one or more of the plurality of light emitting devices.

3. The unit pixel of claim 1, wherein the at least one light scattering line extends from one side of the transparent substrate to the other side opposite thereto.

4. The unit pixel of claim 3, wherein the at least one light scattering line further includes a plurality of light scattering lines positioned to be orthogonal to one another.

5. The unit pixel of claim 4, wherein: the plurality of light scattering lines is disposed to surround the light emitting devices.

6. The unit pixel of claim 4, further comprising:

a plurality of windows corresponding to and exposing one or more of the plurality of light emitting devices, and the plurality of light scattering lines overlaps with the one or more of the plurality of light emitting devices by extending over and across one or more windows among the plurality of windows.

7. The unit pixel of claim 6, wherein the plurality of light scattering lines includes a first line crossing over entire light emitting devices and a plurality of second lines crossing over each of the light emitting devices.

8. The unit pixel of claim 1, wherein the continuous elongate void of each of the at least one light scattering line is completely enclosed within the transparent substrate.

9. The unit pixel of claim 1, wherein:

the light blocking layer includes a plurality of windows respectively corresponding to the plurality of light emitting devices, and the at least one light scattering line includes a plurality of light scattering lines disposed across, or around the plurality of windows.

10. The unit pixel of claim 1, wherein the at least one light scattering line crosses over the at least one window.

11. The unit pixel of claim 1, wherein the at least one light scattering line has an average height of 10 μm or less.

12. A unit pixel comprising:

a plurality of sub-pixels comprising a first sub-pixel and a second sub-pixel, the first sub-pixel comprising:

a first transparent substrate formed of a single layer of transmissive material and including a first light incident surface and a first light exiting surface; and a first light emitting device disposed adjacent to the first transparent substrate and operable to emit light of a selected color, the second sub-pixel comprising:

a second transparent substrate formed of a single layer of transmissive material and including a second light incident surface and a second light exiting surface; and a second light emitting device disposed adjacent to the second transparent substrate and operable to emit light of a different color from the first light emitting device; and at least one light scattering line located within the first transparent substrate, within the second transparent substrate, or both, and positioned to be around or across the first light emitting device, the second light emitting device, or both in at least one predetermined pattern, wherein each of the at least one light scattering line comprises a continuous elongate void completely enclosed within the first transparent substrate located between and spaced from the first light incident and first light exiting surfaces or completely enclosed within the second transparent substrate located between and spaced from the second light incident and second light exiting surfaces and having a length that is at least as long as a lateral dimension of each of the corresponding one or more of the plurality of light emitting devices.

13. The unit pixel of claim 12, wherein:

the first transparent substrate and the second transparent substrate form a common transparent substrate;

the common transparent substrate further includes a second light scattering line including a plurality of voids spaced apart from one another arranged in the common transparent substrate; and the second light scattering line extends from one side of the common transparent substrate to the other side opposite thereto.

14. The unit pixel of claim 12, wherein:

the first transparent substrate is arranged on the first light emitting device and the second transparent substrate is arranged on the second light emitting device;

the at least one light scattering line includes a first light scattering line arranged in the first transparent substrate and a second light scattering line arranged in the second transparent substrate; and the first transparent substrate, the second transparent substrate, or both include a growing substrate for growing the first light emitting device, the second light emitting device, or both.

15. A displaying apparatus comprising:

a circuit board; and a plurality of unit pixels disposed on the circuit board;

each of the plurality of unit pixels comprising:

a plurality of light emitting devices operable to emit light of different colors from one another;

a transparent substrate comprising a single transmissive material covering all of the plurality of light emitting devices and including a light incident surface and a light exiting surface, wherein the light generated from the plurality of light emitting devices enters via the light incident surface of the transparent substrate and exits the transparent substrate through the light exiting surface; and at least one light scattering line located within the single transmissive material of the transparent substrate, spaced from the light incident and light exiting surfaces, and corresponding to one or more of the plurality of light emitting devices in a predetermined pattern, wherein each of the at least one light scattering line comprises a continuous elongate void within the single transmissive material of the transparent substrate having a length that is at least as long as a lateral dimension of each of the corresponding one or more of the plurality of light emitting devices, wherein:

the plurality of light emitting devices are spaced apart and arranged adjacent to the transparent substrate, and each unit pixel further comprises a light blocking layer disposed between the transparent substrate and a respective light emitting device, the light blocking layer has at least one window configured to pass the light generated from the plurality of light emitting devices towards the light incident surface of the transparent substrate, and the at least one light scattering line is disposed so as to correspond to the at least one window.

16. The displaying apparatus of claim 15, wherein the at least one light scattering line further includes a continuous void or voids spaced apart from one another.

17. The displaying apparatus of claim 15, wherein the at least one light scattering line extends from one side of the transparent substrate to an opposite side of the transparent substrate.

18. The displaying apparatus of claim 15, wherein:

the continuous elongate void of each of the at least one light scattering line is completely enclosed within the transparent substrate.

19. The displaying apparatus of claim 15, wherein:

wherein the length of the continuous void is at least as long as a length of each of the corresponding one or more of the plurality of light emitting devices.

20. The displaying apparatus of claim 15, the circuit board further includes a plurality of pads; and each of the unit pixels is bonded to the plurality of pads through a bonding material.

* * * * *